U S011239586B2

United States Patent
Zheng et al.

(10) Patent No.: US 11,239,586 B2
(45) Date of Patent: Feb. 1, 2022

(54) CABLE ASSEMBLY MODULES DETACHABLY MOUNTED UPON CORRESPONDING CIRCUIT PADS

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Jie Zheng, Rowland-Heighls, CA (US); Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/989,785

(22) Filed: Aug. 10, 2020

(65) Prior Publication Data
US 2021/0044040 A1 Feb. 11, 2021

Related U.S. Application Data

(60) Provisional application No. 62/885,204, filed on Aug. 10, 2019, provisional application No. 62/959,886, filed on Jan. 11, 2020.

(51) Int. Cl.
*H01R 12/00* (2006.01)
*H01R 12/71* (2011.01)
(Continued)

(52) U.S. Cl.
CPC ......... *H01R 12/714* (2013.01); *H01R 13/405* (2013.01); *H01R 13/518* (2013.01); *H01R 13/631* (2013.01); *H01R 13/6581* (2013.01); *H01R 13/6597* (2013.01); *H01R 25/00* (2013.01); *H05K 1/11* (2013.01); *H05K 2201/10325* (2013.01)

(58) Field of Classification Search
CPC .. H01R 12/712; H01R 12/714; H01R 13/405; H01R 13/518; H01R 13/631; H01R 13/6581; H01R 13/6597; H01R 25/00; H05K 1/11; H05K 2201/10325
USPC ...................................... 439/55, 79
See application file for complete search history.

(56) References Cited

U.S. PATENT DOCUMENTS

| 10,923,843 | B1 * | 2/2021 | Henry | H01R 12/716 |
| 11,125,958 | B2 * | 9/2021 | Champion | G02B 6/4278 |
| 2019/0288422 | A1 | 9/2019 | Te | |

\* cited by examiner

*Primary Examiner* — Khiem M Nguyen
(74) *Attorney, Agent, or Firm* — Ming Chieh Chang; Wei Te Chung

(57) ABSTRACT

A cable assembly module includes: a front mating member; a rear cable linked behind the mating member and including a pair of signal wires; a pair of signal contacts retained upon the front mating member, each of said signal contacts including a middle retaining section associated with the front mating member, a front mating section spaced from the front mating member in a deflectable manner, and a rear connecting section mechanically and electrically connected to the corresponding signal wires, respectively; and a pair of grounding contacts located by two sides of the pair of signal contacts; wherein the front mating sections are adapted for being directly mated with circuit pads of a printed circuit board disposed in a plane, and the rear cable extends along a direction inclined with the plane.

20 Claims, 52 Drawing Sheets

(51) Int. Cl.
*H01R 13/6581* (2011.01)
*H01R 25/00* (2006.01)
*H01R 13/6597* (2011.01)
*H01R 13/631* (2006.01)
*H05K 1/11* (2006.01)
*H01R 13/518* (2006.01)
*H01R 13/405* (2006.01)

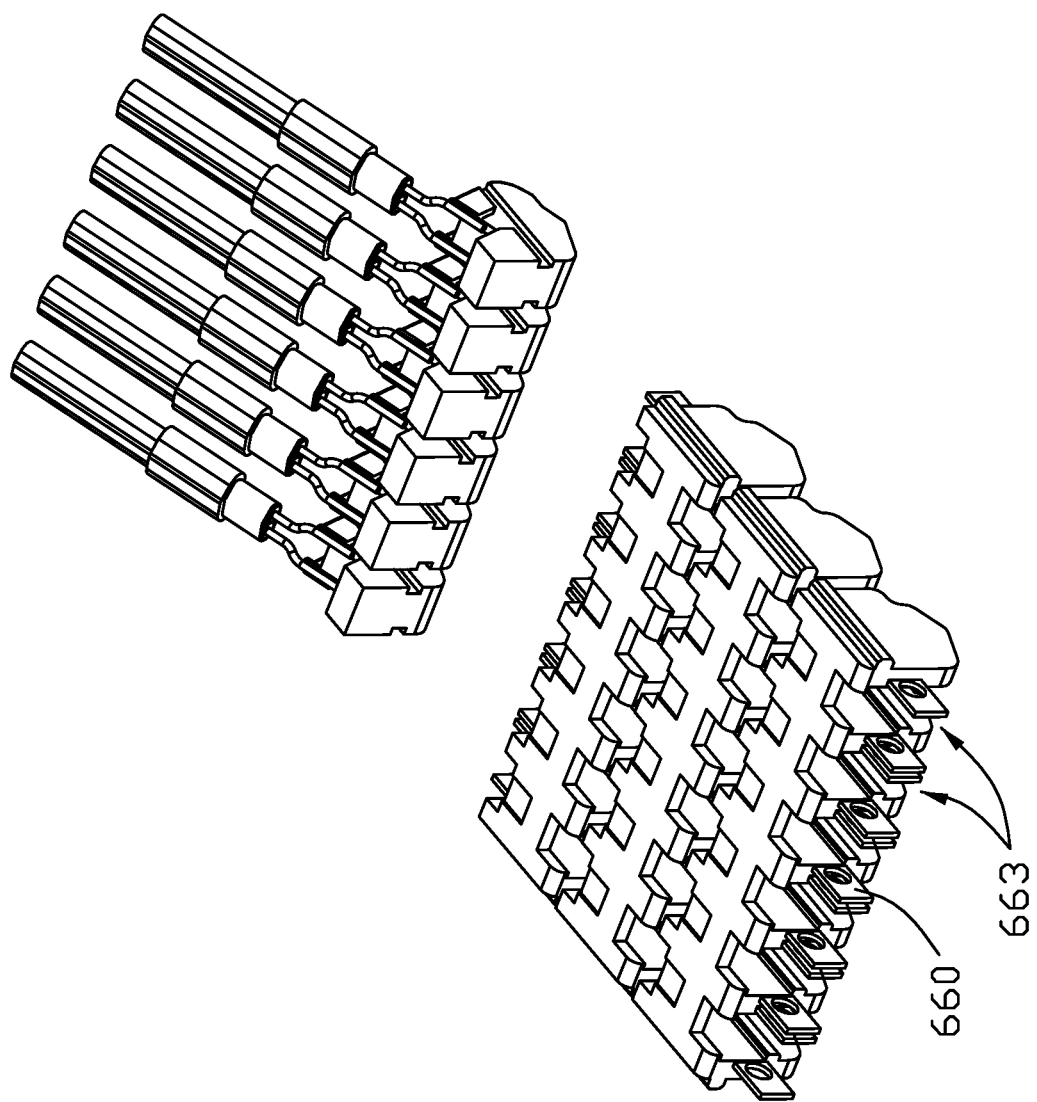

CABLE ASSEMBLY MODULES DETACHABLY MOUNTED UPON CORRESPONDING CIRCUIT PADS

BACKGROUND OF THE INVENTION

1. Field of the Invention

The present invention relates generally to an electrical connector assembly module, and more particularly to the cable assembly modules detachably mounted upon corresponding circuit pads on a printed circuit board.

2. Description of Related Art

It is desirable to use multiple identical cable assembly modules densely arranged with one another on the printed circuit board for data transmission. Anyhow, the shielding effect is desired not only of the respective cable assembly modules but also between the neighboring cable assembly modules.

SUMMARY OF THE INVENTION

An object of the invention is to provide a cable assembly module having low profile.

To achieve the above-mentioned object, a cable assembly module comprises: a front mating member; a rear cable linked behind the mating member and including a pair of signal wires; a pair of signal contacts retained upon the front mating member, each of said signal contacts including a middle retaining section associated with the front mating member, a front mating section spaced from the front mating member in a deflectable manner, and a rear connecting section mechanically and electrically connected to the corresponding signal wires, respectively; and a pair of grounding contacts located by two sides of the pair of signal contacts; wherein the front mating sections are adapted for being directly mated with circuit pads of a printed circuit board disposed in a plane, and the rear cable extends along a direction inclined with the plane.

Another object of the invention is to provide an electrical assembly having low profile.

To achieve the above-mentioned object, an electrical assembly comprises: a printed circuit board having two rows of circuit pads thereon; a retainer assembled upon the printed circuit board to cover said circuit pads; two rows of identical cable assembly modules spaced from each other in a front-to-back direction, each of said cable assembly modules comprising a front mating member with corresponding contacts thereon, and a rear cable mechanically and electrically connected to the contacts; wherein the cable assembly modules are assembled into the retainer in an oblique manner.

BRIEF DESCRIPTION OF THE DRAWINGS

FIG. 26(A) is an exploded perspective view of the cable modules of electrical cable assembly of FIG. 25(A);

DETAILED DESCRIPTION OF THE PREFERRED EMBODIMENT

Figure 1:
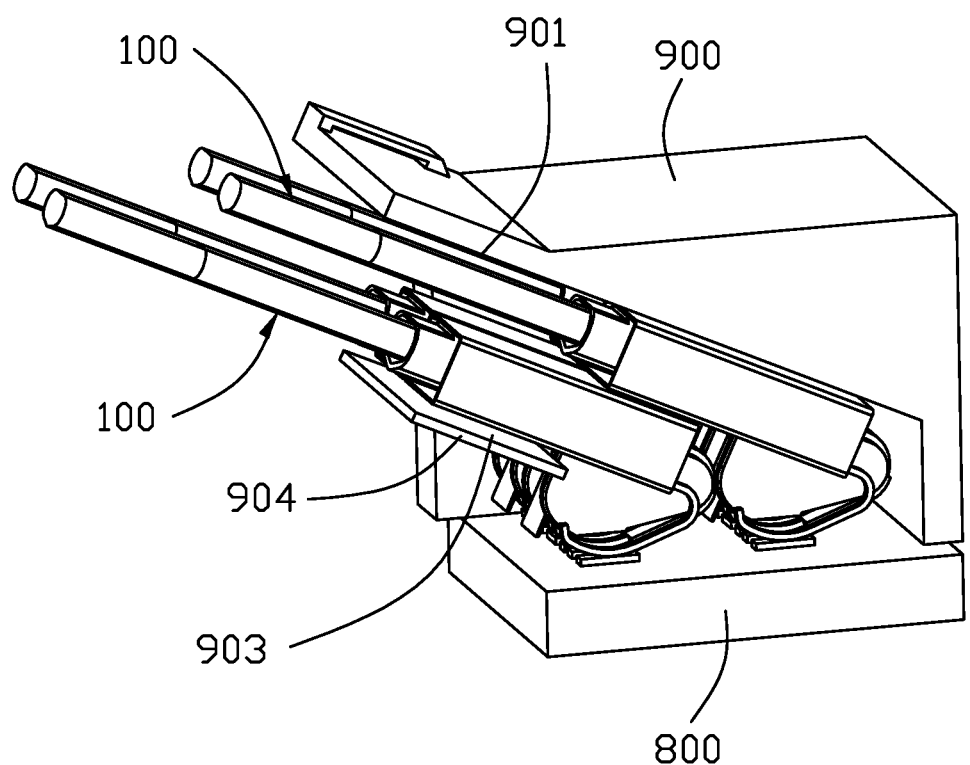
FIG. 1 is a perspective view of a first embodiment of an electrical assembly according to the invention.
Figure 2:
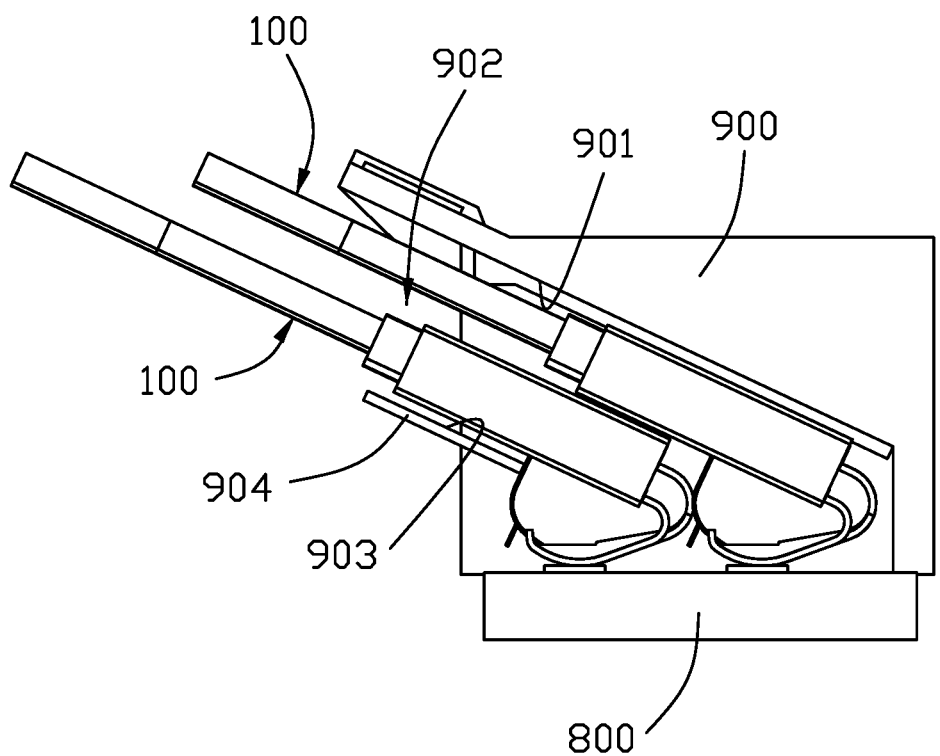
FIG. 2 is a side view of the electrical assembly of FIG. 1.
Figure 3:
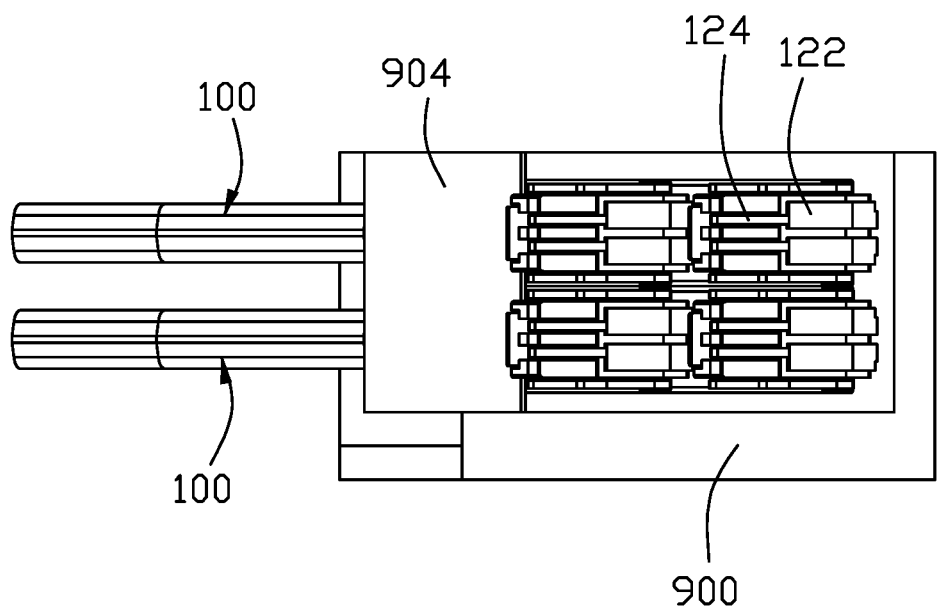
FIG. 3 is a bottom view of the electrical assembly of FIG. 1.
Figure 4:
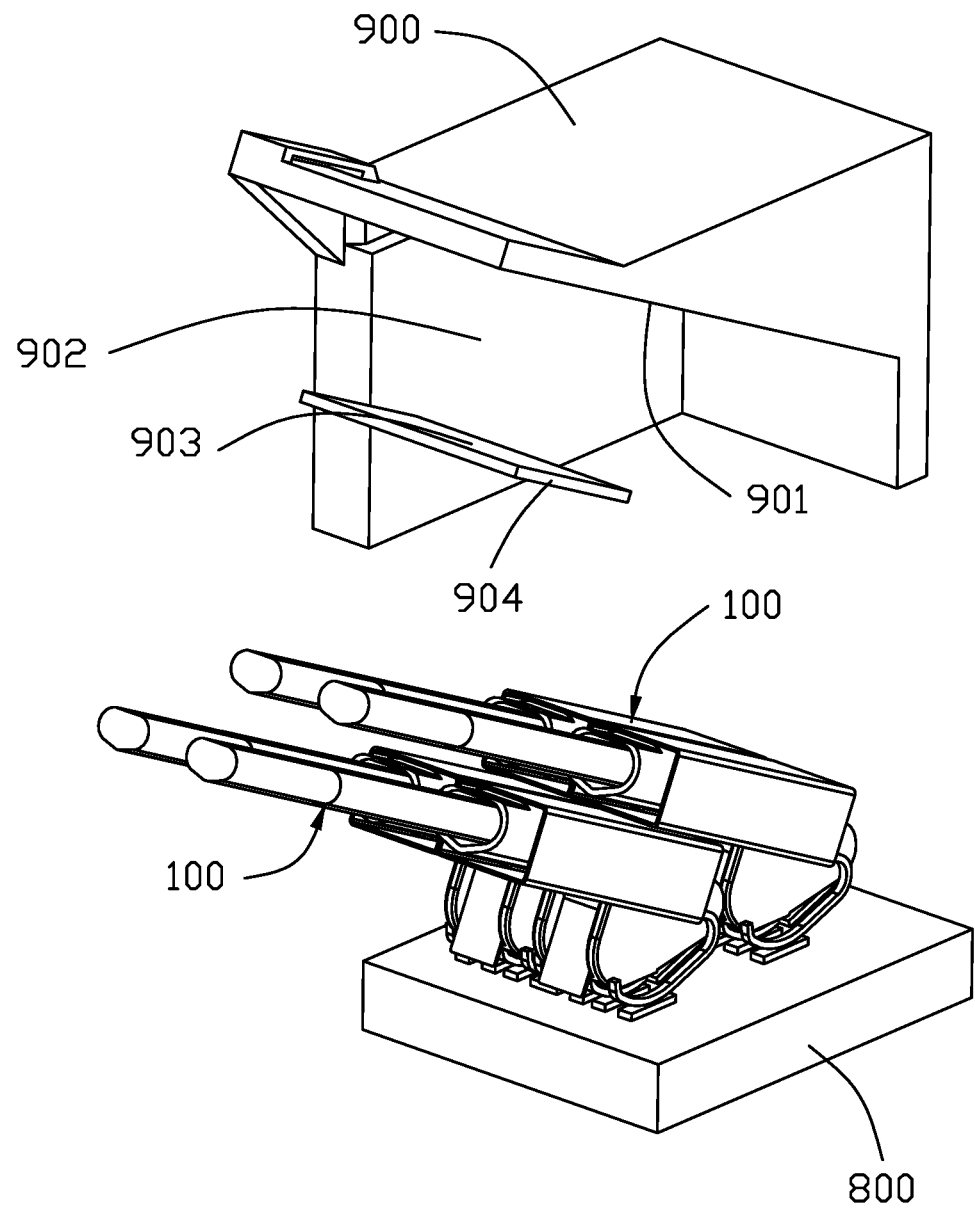
FIG. 4 is an exploded perspective view of the electrical assembly of FIG. 1.
Figure 5A:
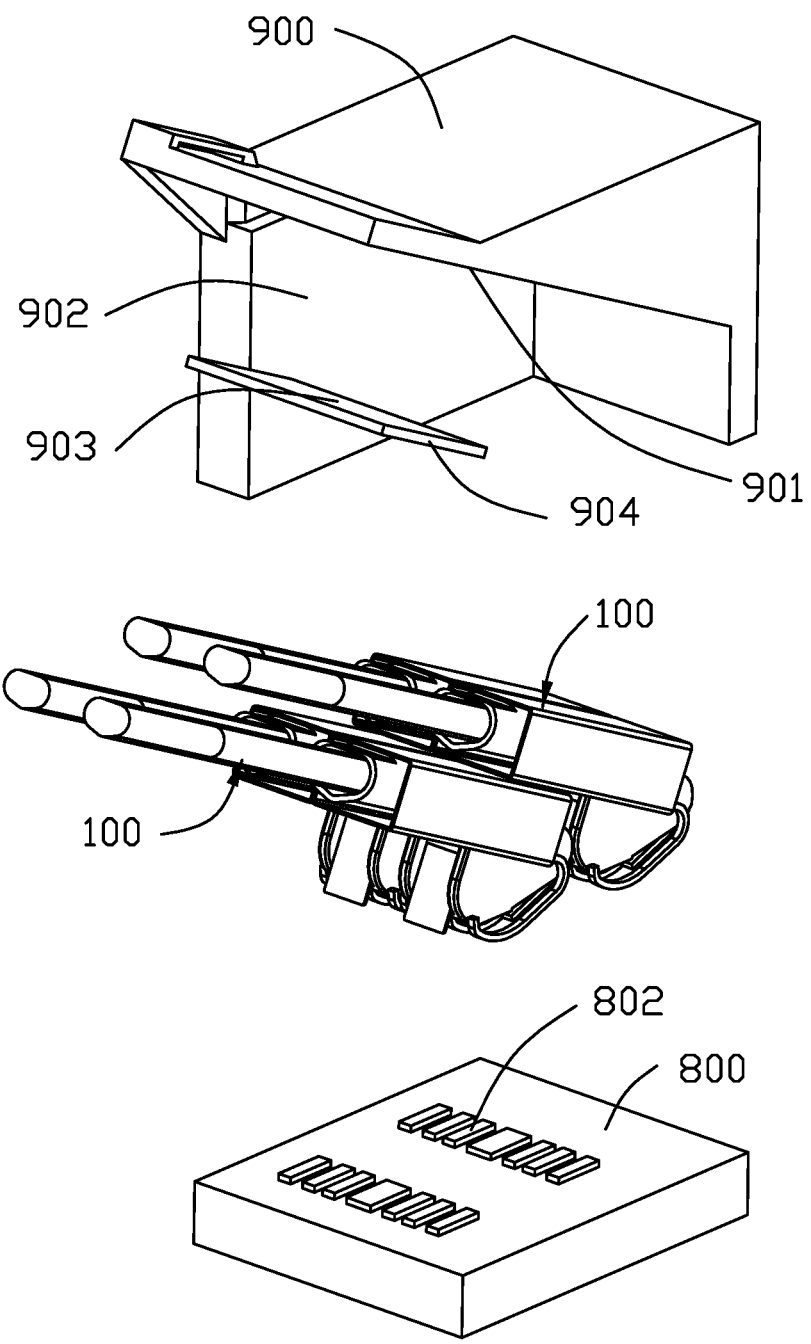
FIG. 5(A) is a further exploded view of the electrical assembly of FIG. 4.
Figure 5B:
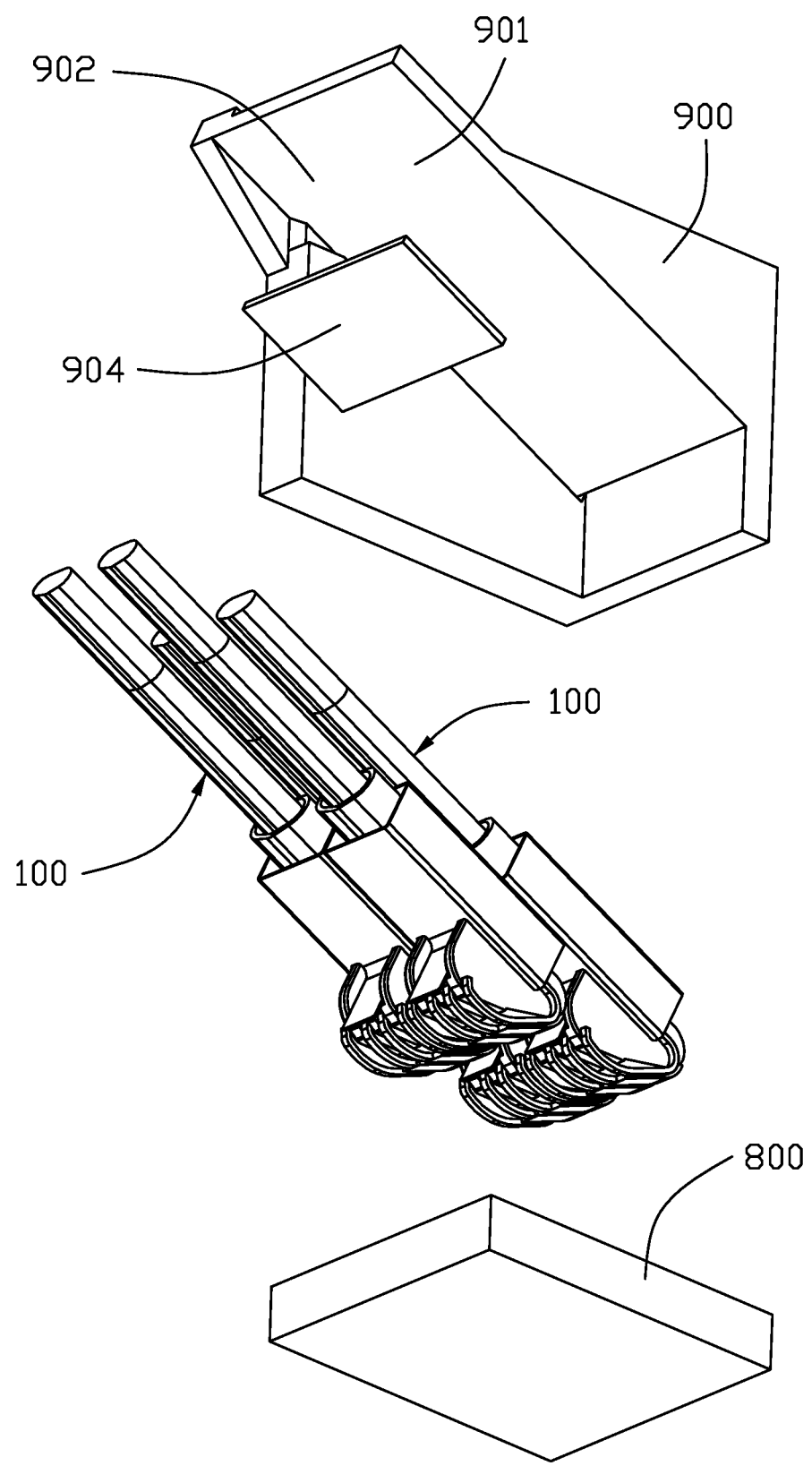
FIG. 5(B) is another exploded perspective view of the electrical assembly of FIG. 5(A)
Figure 6A:
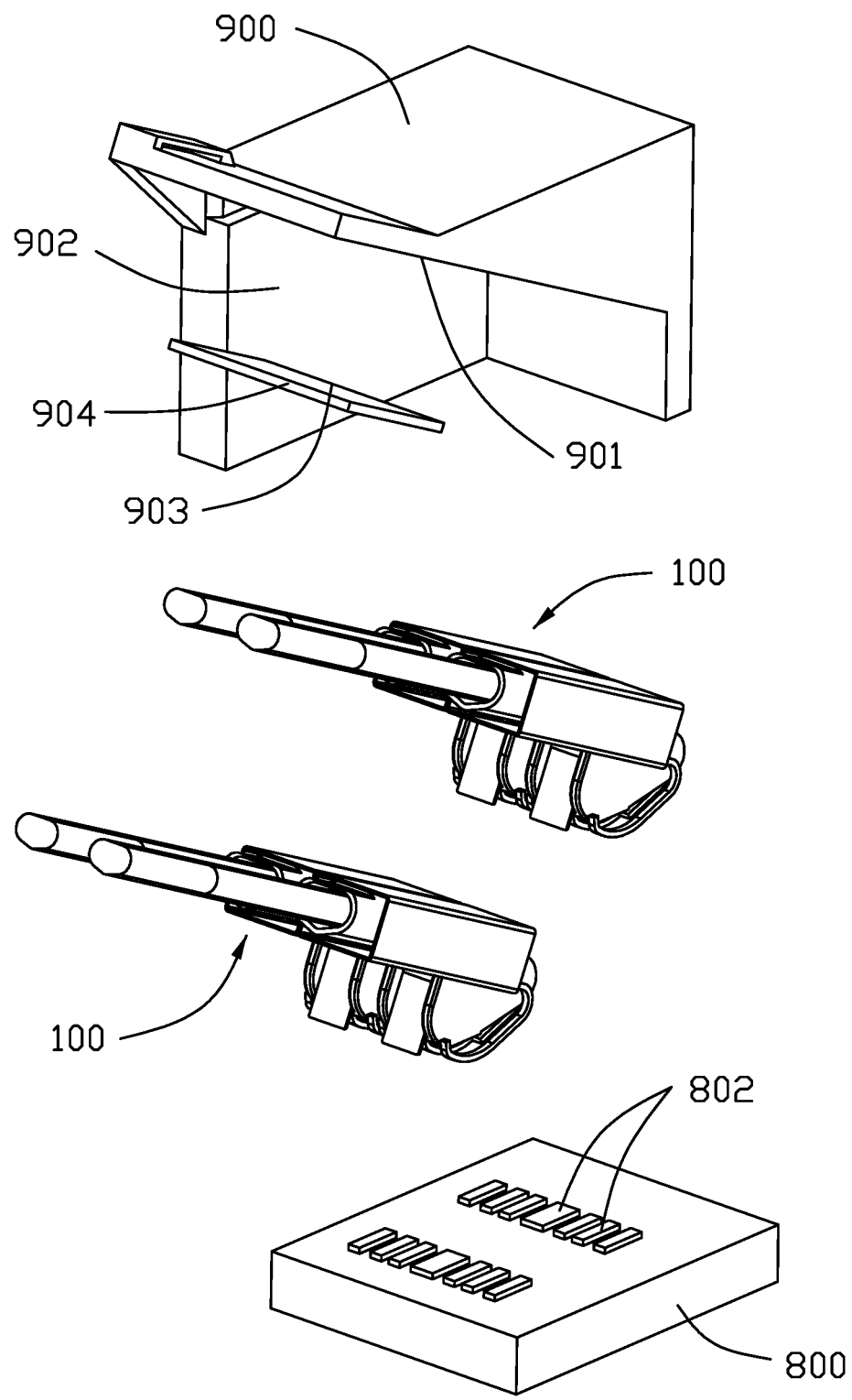
FIG. 6(A) is a further exploded perspective view of the electrical assembly of FIG. 5(A)
Figure 6B:
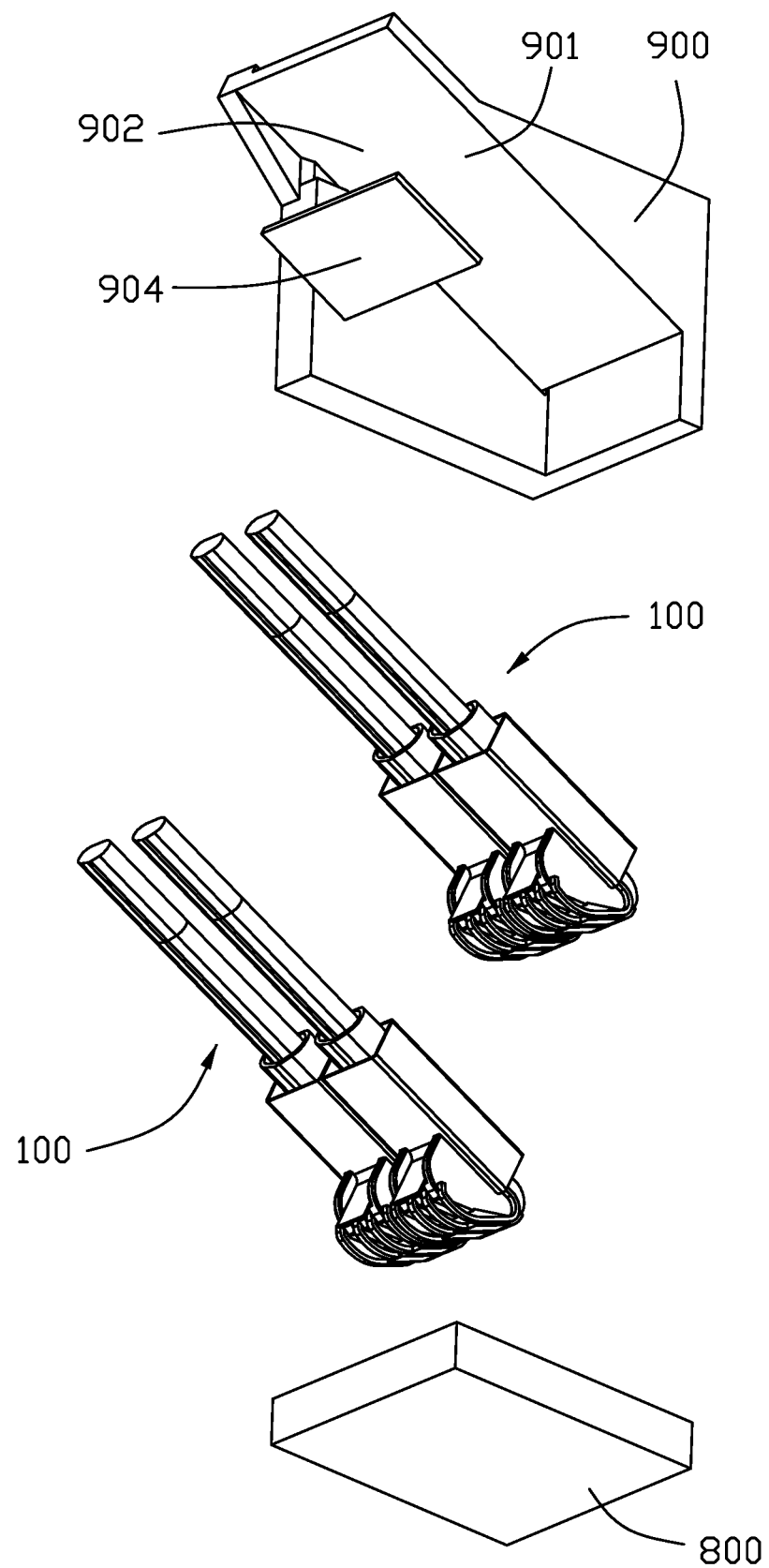
FIG. 6(B) another exploded perspective view of the electrical assembly of FIG. 6(A)
Figure 7A:
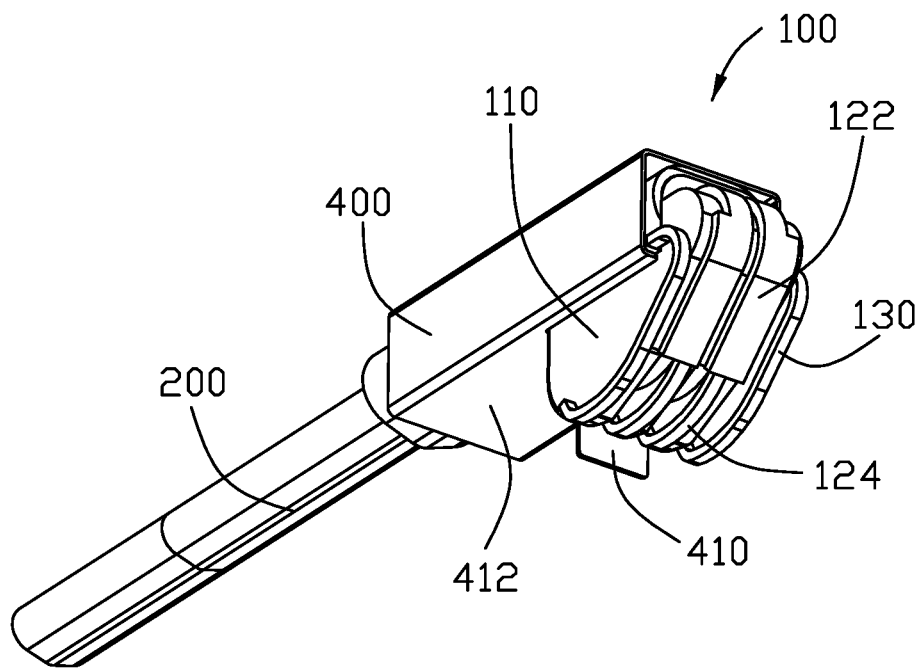
FIG. 7(A) is a perspective view of a cable assembly module of the electrical assembly of FIG. 1.
Figure 7B:
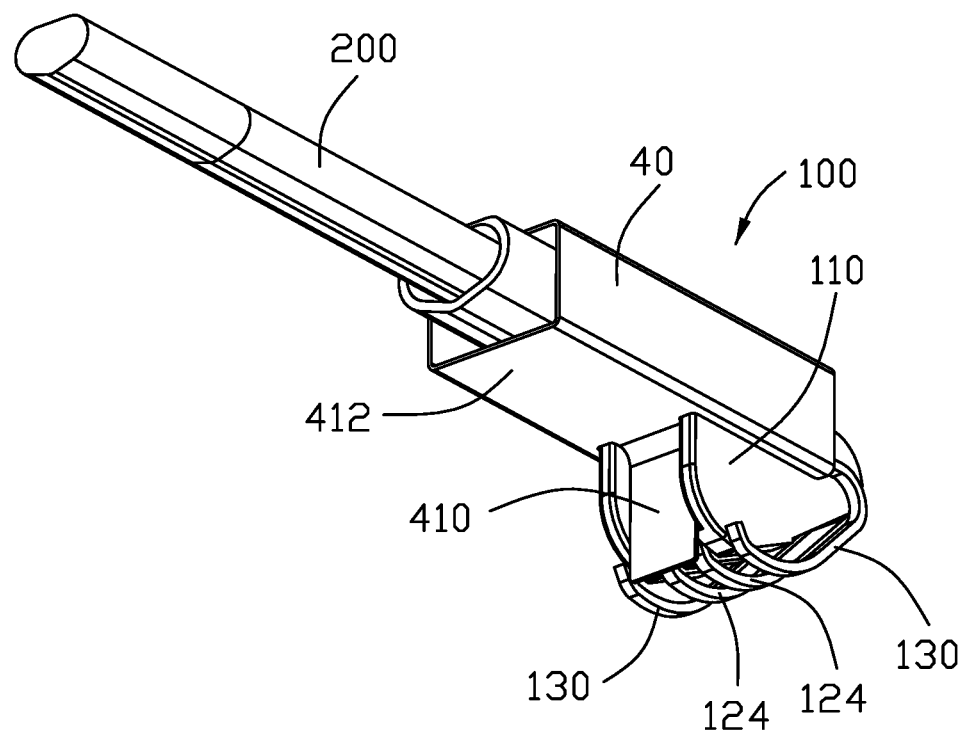
FIG. 7(B) is another perspective view of the cable assembly module of the electrical assembly of FIG. 7(A)
Figure 7C:
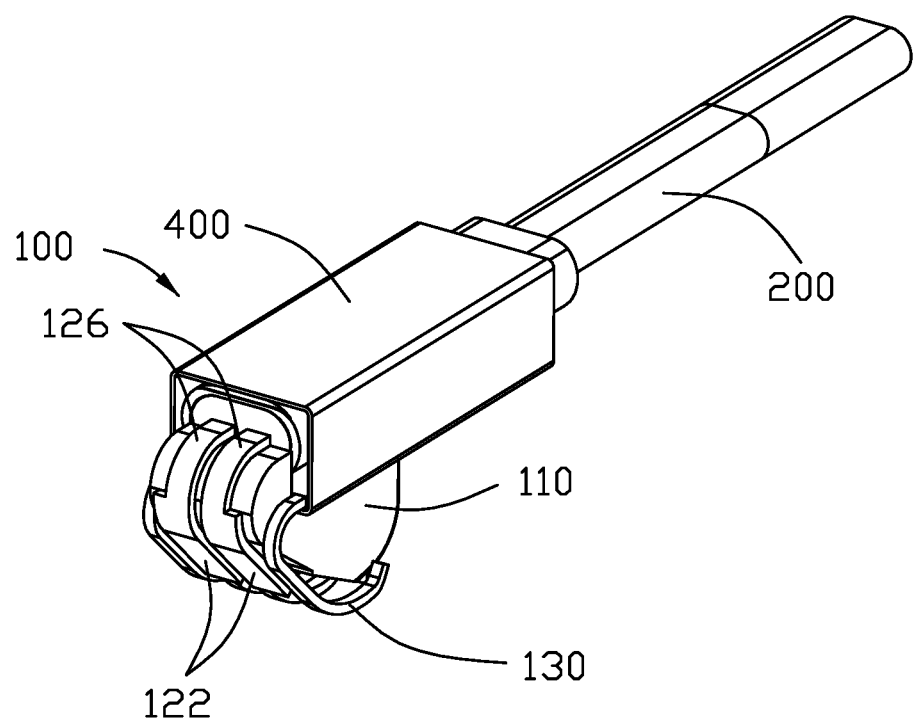
FIG. 7(C) is another perspective view of the cable assembly module of the electrical assembly of FIG. 7(A)
Figure 8:
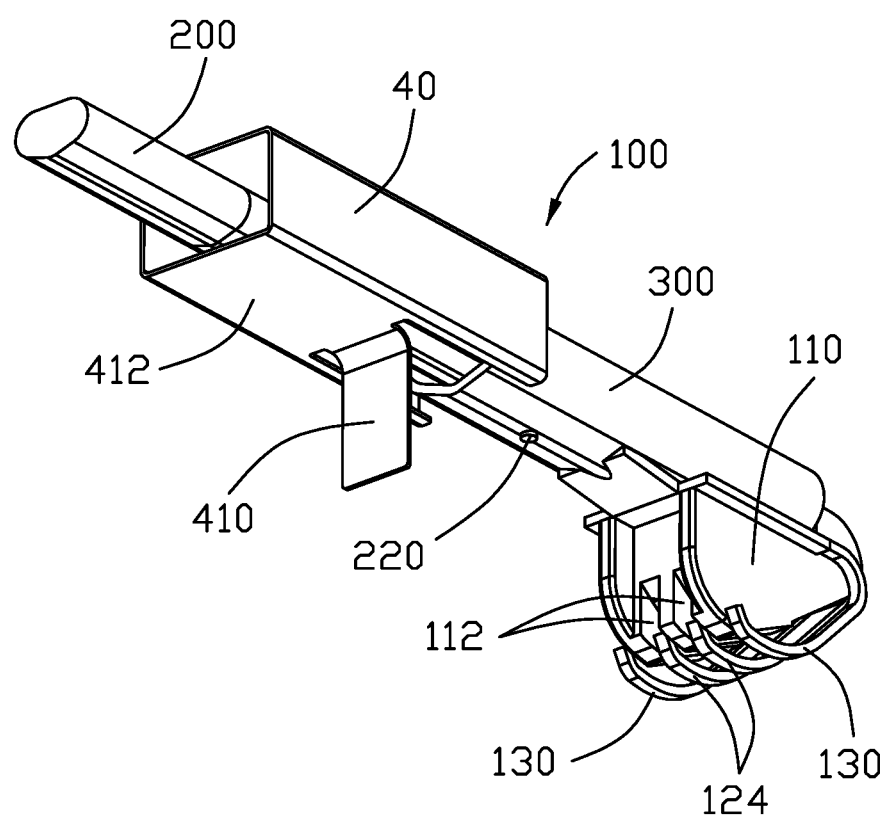
FIG. 8 is an exploded perspective view of the cable assembly module of the electrical assembly of FIG. 7(A)
Figure 9A:
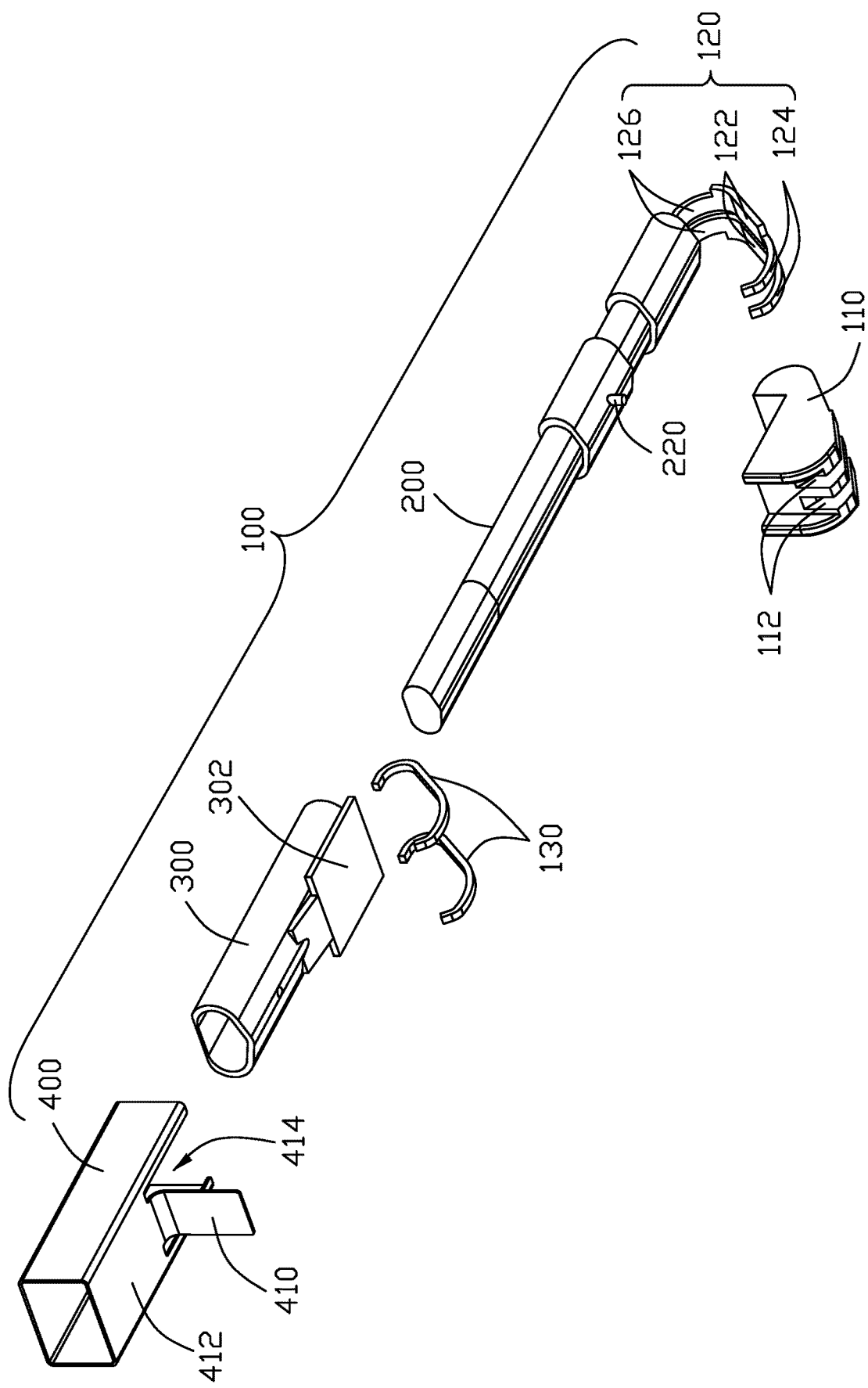
FIG. 9(A) is a further exploded perspective view of the cable assembly module of the electrical assembly of FIG. 8.
Figure 9B:
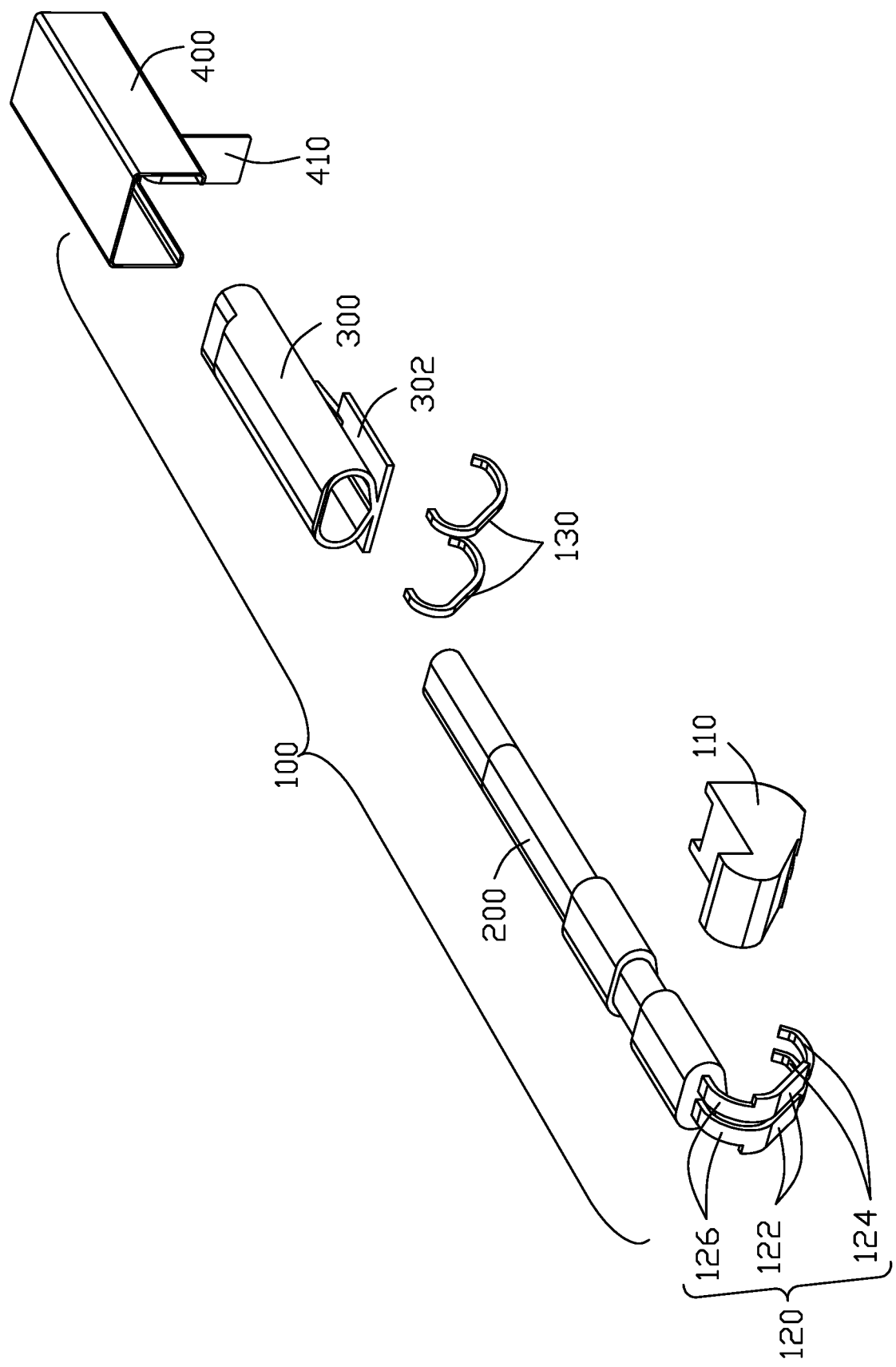
FIG. 9(B) is another exploded perspective view of the cable assembly module of the electrical assembly of FIG. 9(A)
Figure 10:
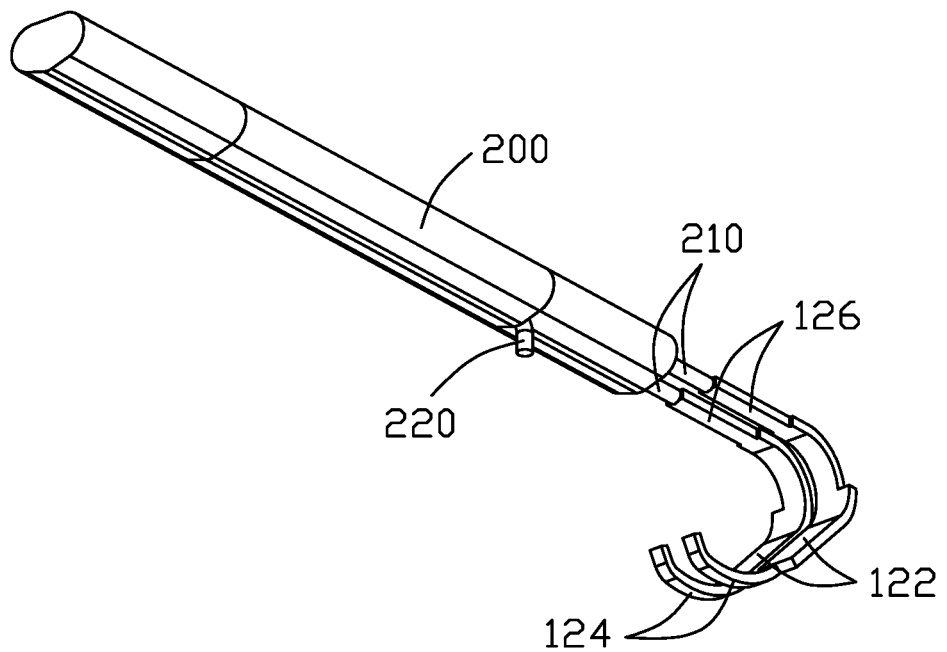
FIG. 10 is a perspective view of a cable and a pair of signal contacts of the cable assembly module of the electrical assembly of FIG. 9(A)
Figure 11A:
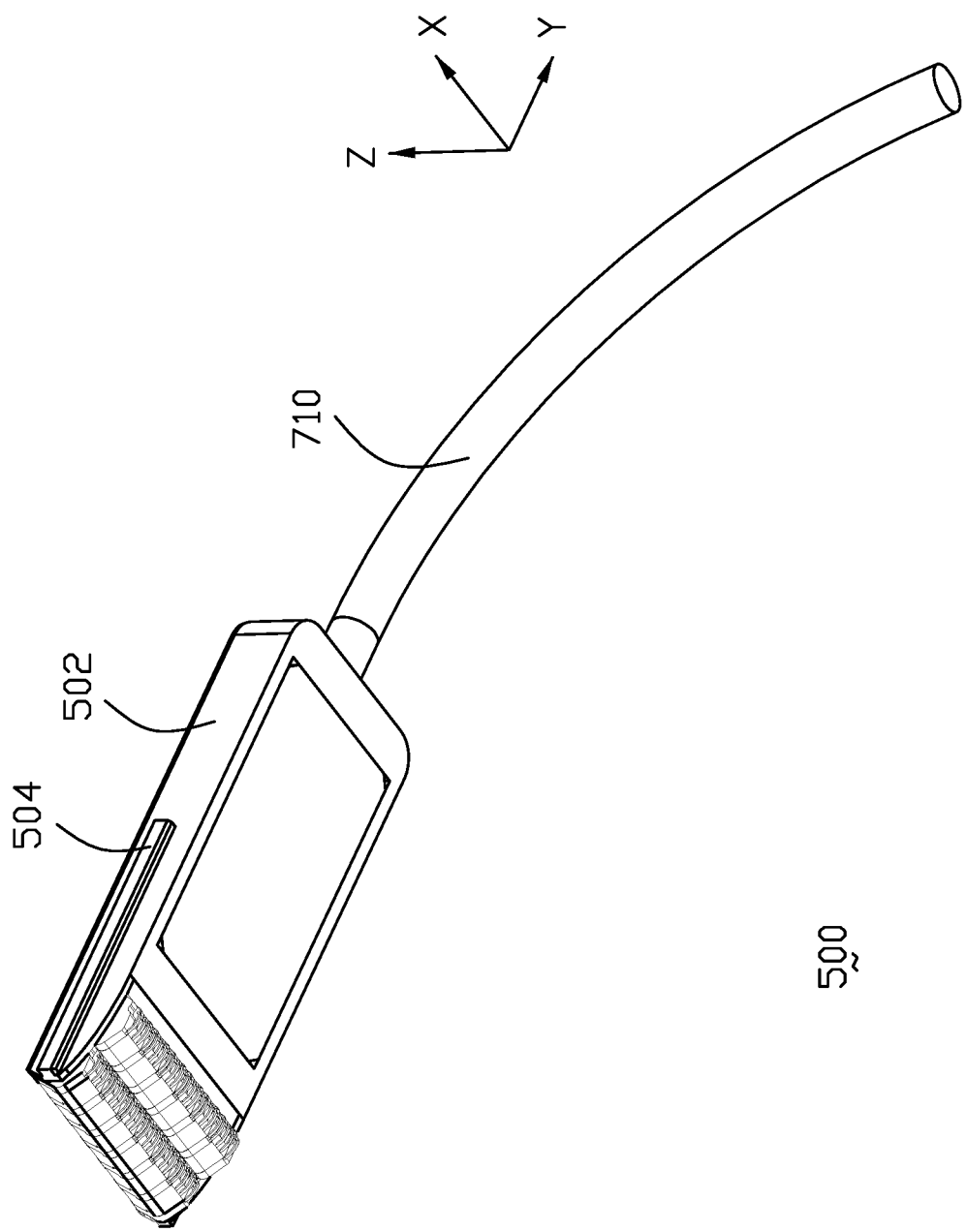
FIG. 11(A) is a perspective view of a second embodiment of an electrical cable assembly according to the invention.
Figure 11B:
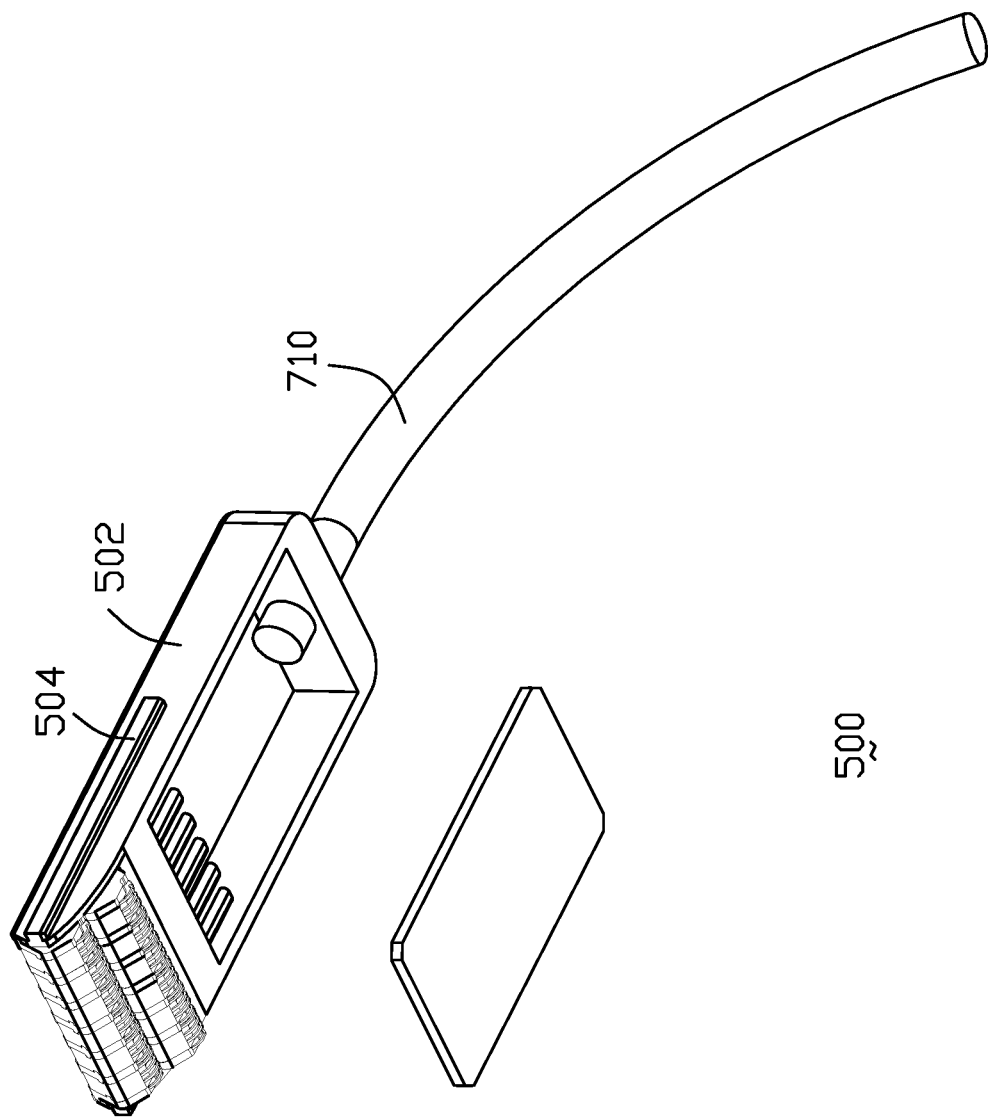
FIG. 11(B) is an exploded perspective view of the electrical cable assembly of FIG. 11(A)
Figure 11C:
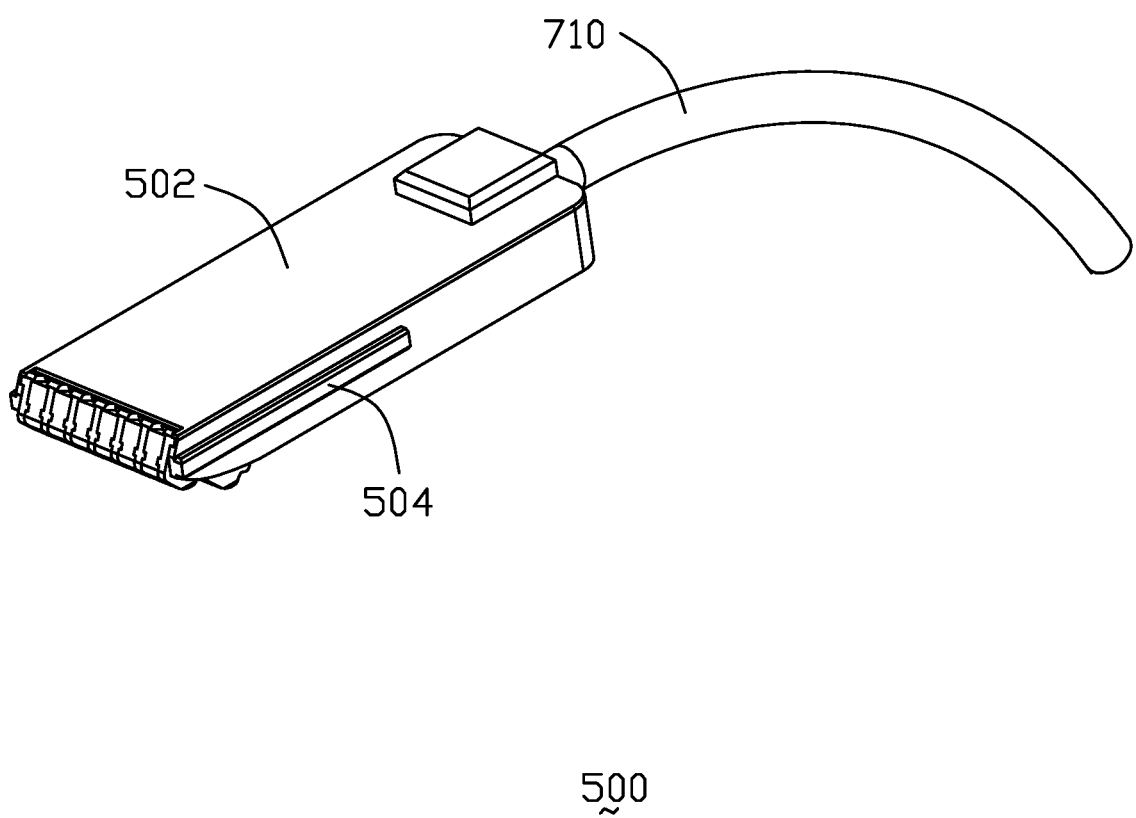
FIG. 11(C) is an exploded perspective view of the electrical cable assembly of FIG. 11(A)
Figure 12A:
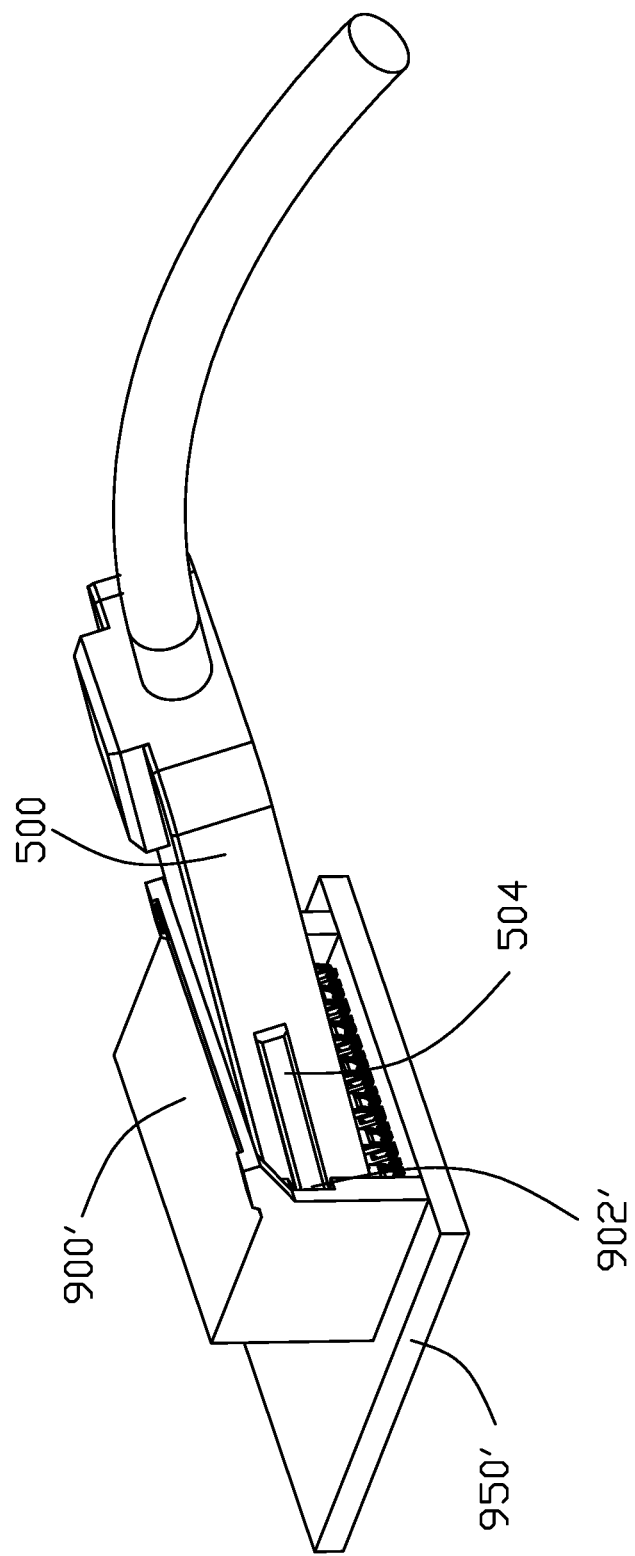
FIG. 12(A) is a perspective view of the electrical cable assembly of FIG. 11(A) received within a retainer mounted upon a printed circuit board.
Figure 12B:
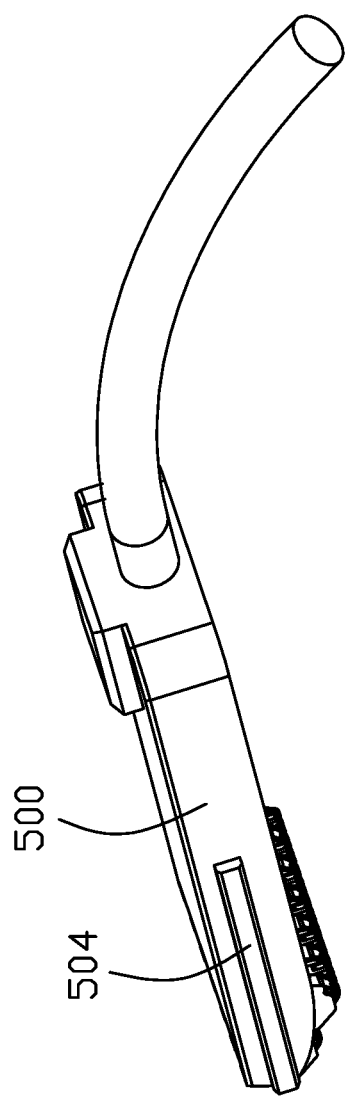
FIG. 12(B) is an exploded perspective view of the electrical cable assembly and the retainer mounted upon a printed circuit board of FIG. 12(A)
Figure 12B:
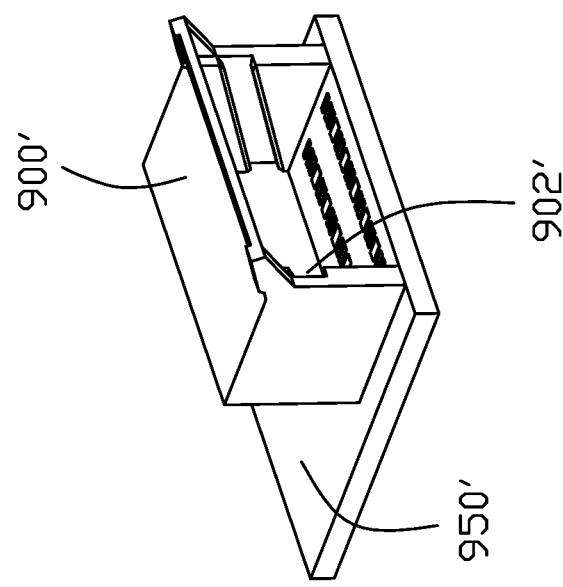
Figure 12C:
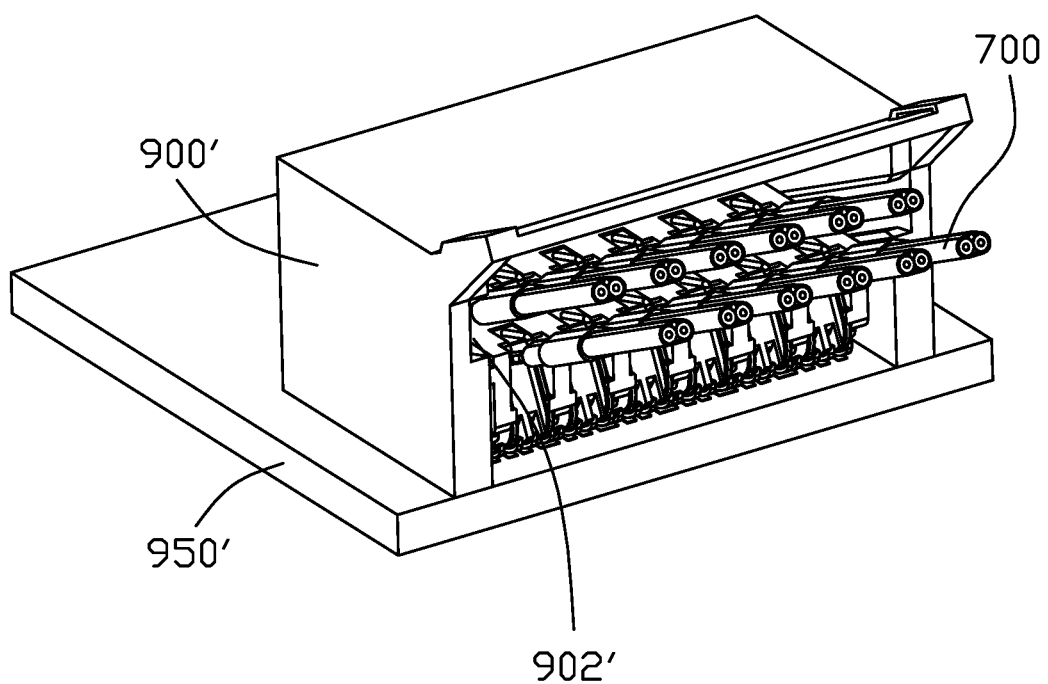
FIG. 12(C) is a perspective view of the electrical cable assembly received within a retainer mounted upon a printed circuit board of FIG. 12(A) with a case of the electrical cable assembly being removed.
Figure 13:
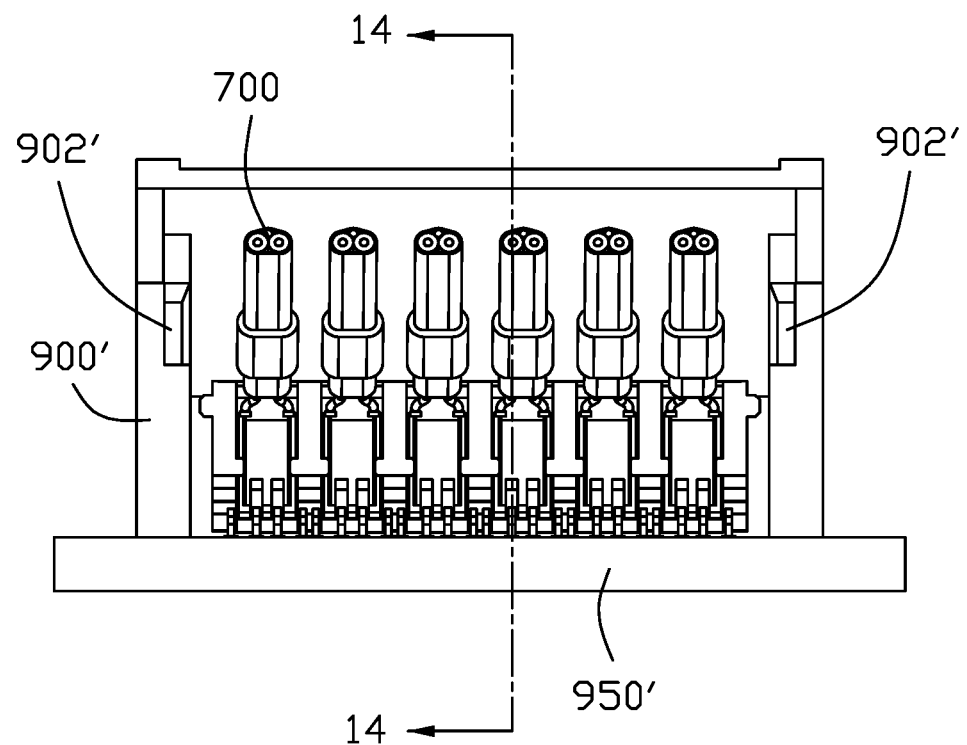
FIG. 13 is an elevational view of the electrical cable assembly and the retainer on the printed circuit board of FIG. 12(C)
Figure 14:
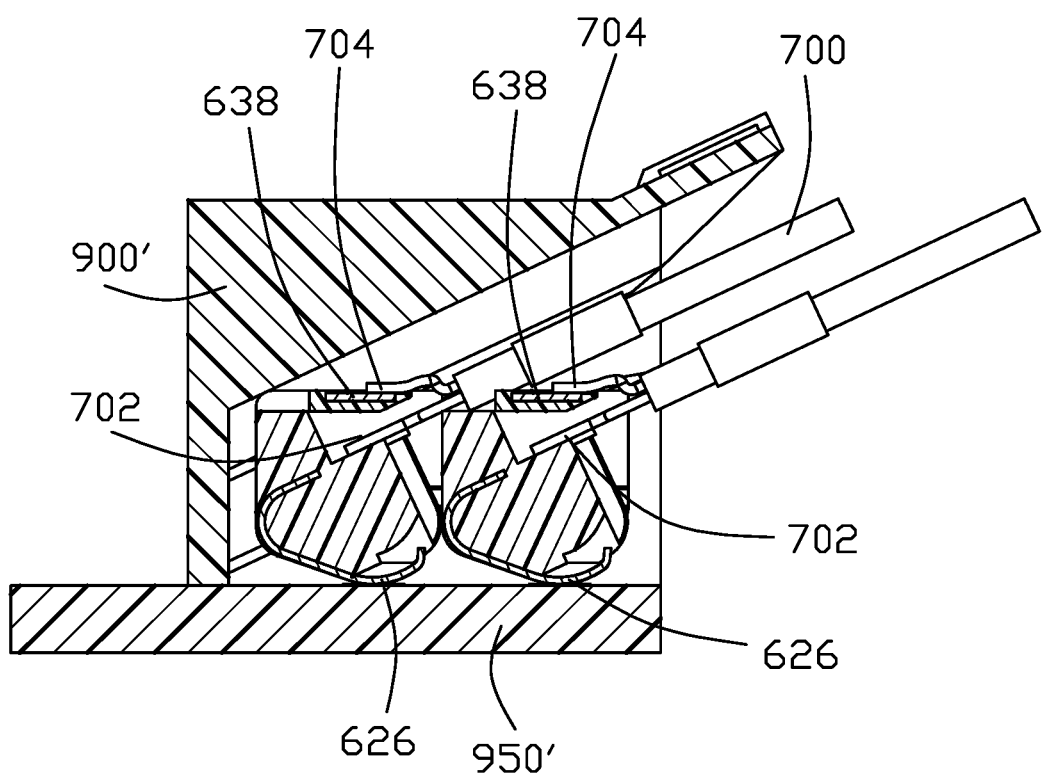
FIG. 14 is a cross-sectional view of the electrical cable assembly and the retainer on the printed circuit board of FIG. 13.
Figure 15A:
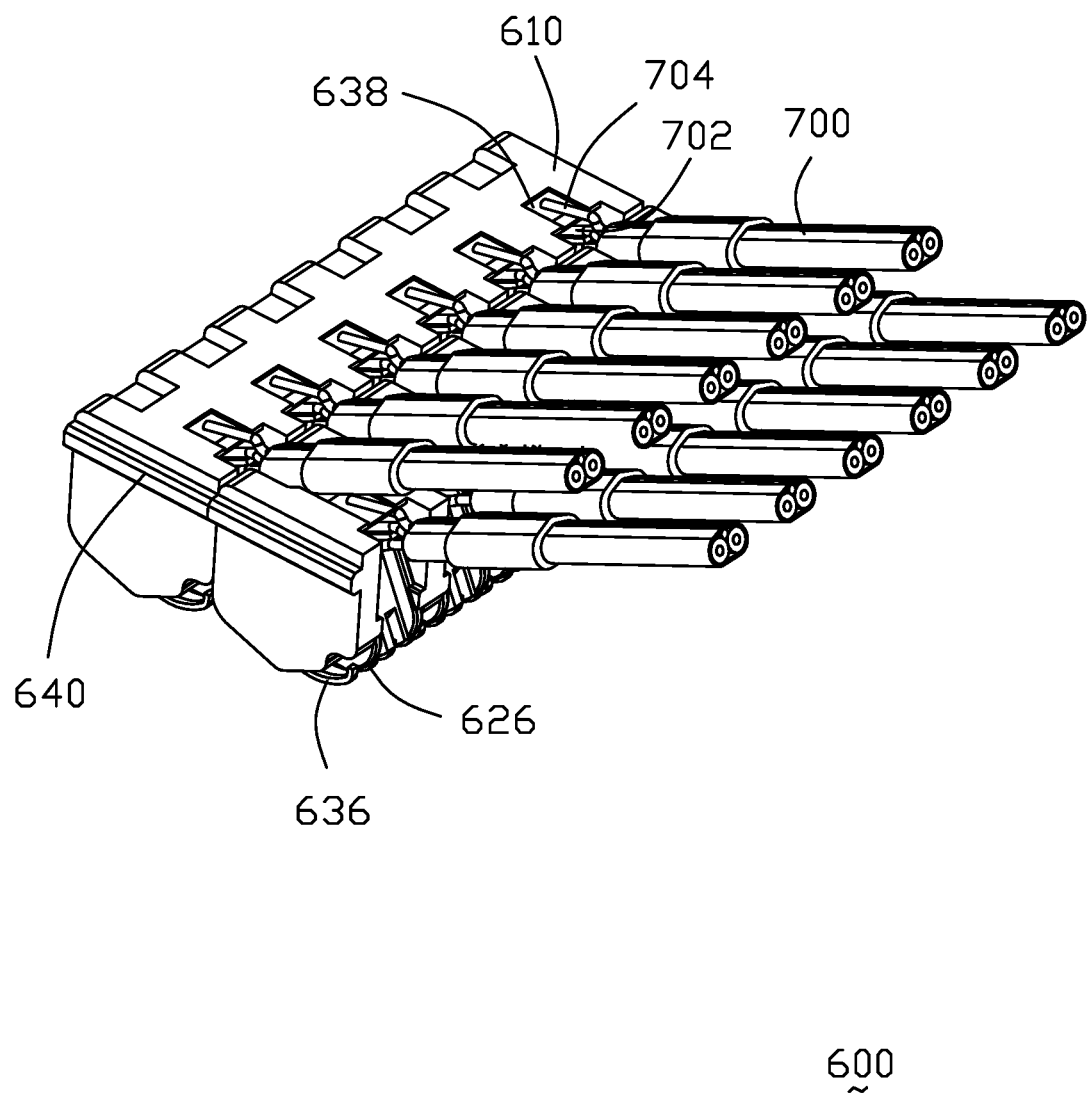
FIG. 15(A) is a perspective view of cable modules of the electrical cable assembly of FIG. 11(A)
Figure 15B:
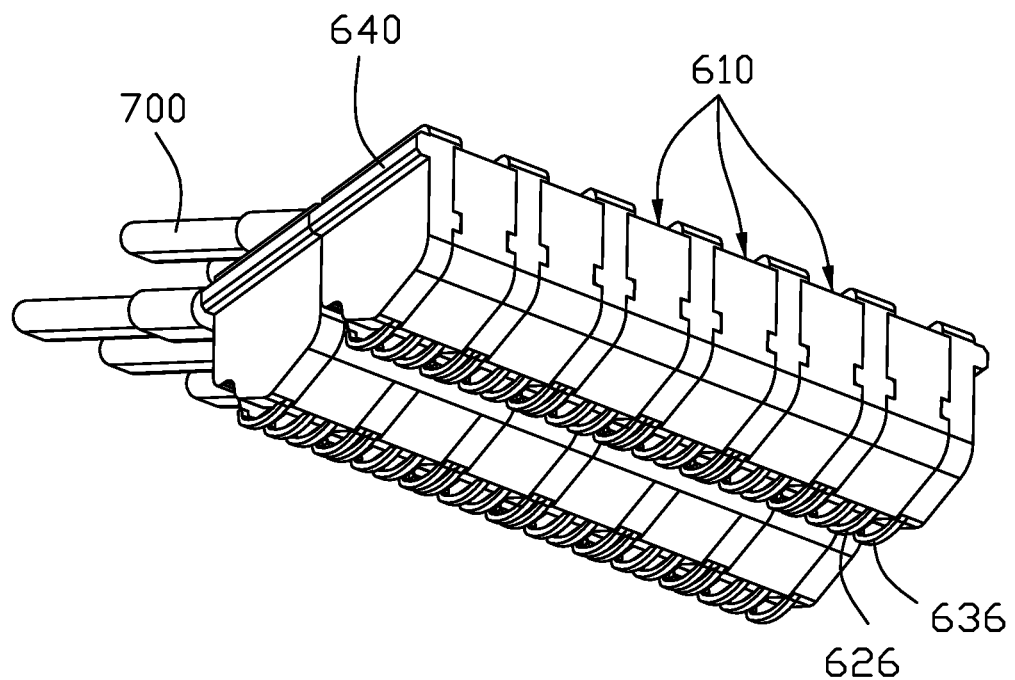
FIG. 15(B) is another perspective view of the cable modules of the electrical cable assembly of FIG. 15(A)
Figure 15C:
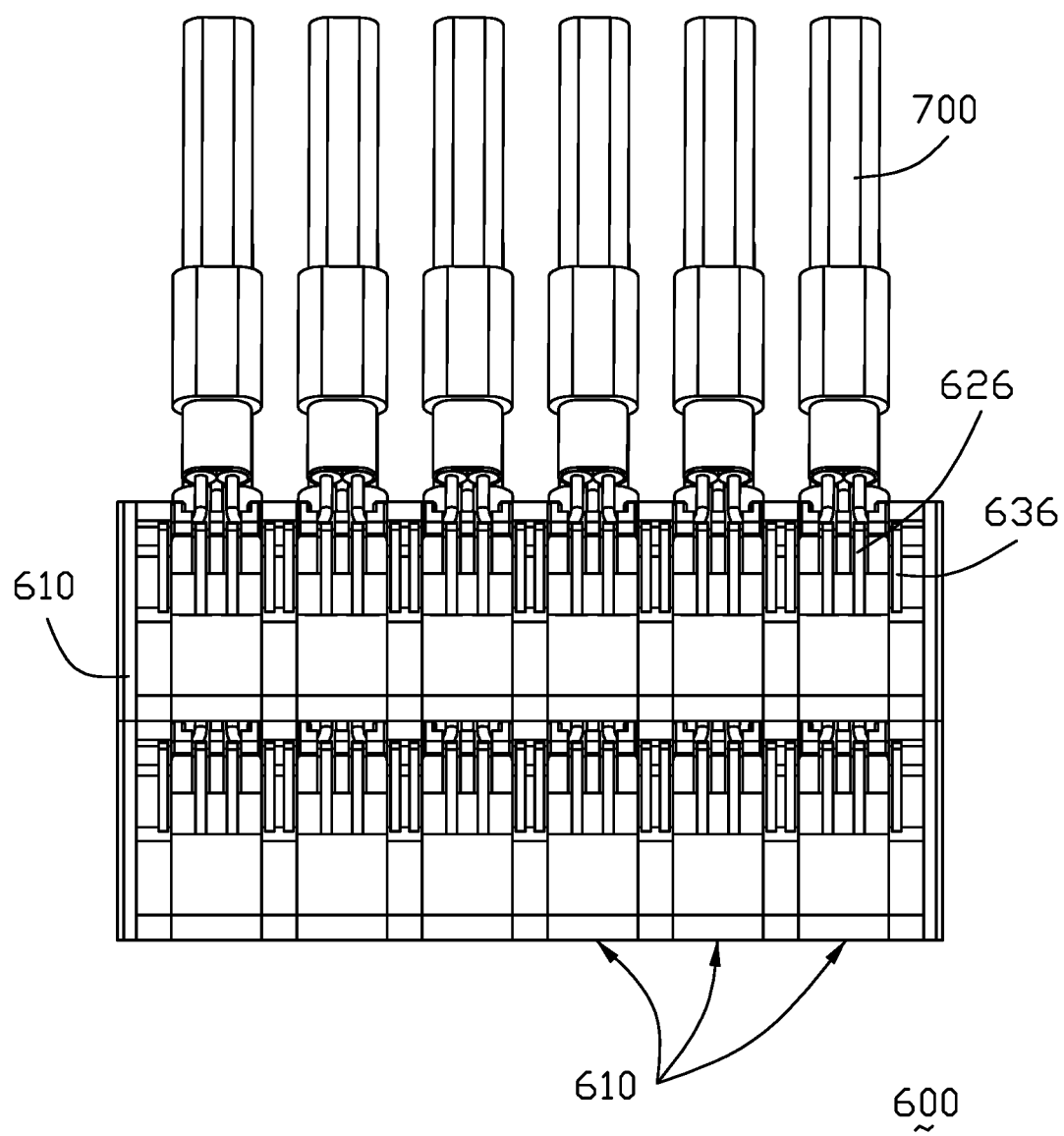
FIG. 15(C) is a top view of the cable modules of the electrical cable assembly of FIG. 15(A)
Figure 16:
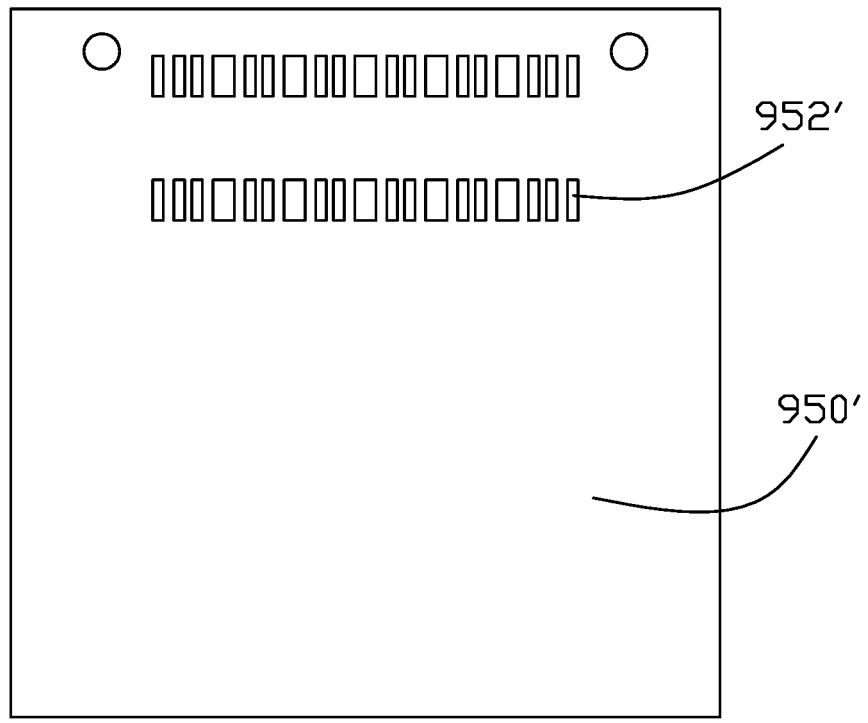
FIG. 16 is a top view of a printed circuit board on which the retainer of FIG. 13 is mounted.

Referring to FIGS. 1-10, a first embodiment of this invention comprises two rows of cable assembly modules 100 are arranged together to be commonly received, in an oblique manner, within a retainer 900 mounted upon a printed circuit board 800 on which the circuit pads 802 are formed. The retainer 900 comprises an upper inclined wall 901, and a lower inclined wall 903 spaced apart from and parallel to the upper inclined wall 91, and an inclined channel or entrance 902 formed in the oblique direction therebetween for the cable assembly modules 100 being entered into the retainer to mate with the circuit pads 802.

Each cable assembly module 100 includes a front mating member 110 having a wedged cross-section thereof, and a rear cable 200 linked behind the front mating member 110 and having a pair of signal wires 210. A pair of signal contacts 120 are retained upon the front mating member 10. Each signal contact 120 has a middle retaining section 122 grasping the front mating member 110, a front mating section 124 spaced from the mating member 110 in a deflectable manner, and a rear connecting section 126 mechanically and electrically connected to an inner conductor (not shown) of the signal wire 210 and spaced from the front mating member 110 in a deflectable manner. The front mating member 110 forms a pair of grooves 112 to receive front ends of the mating sections 124 of the pair of signal contacts 120 to prevent mechanical stubbing of the deflectable mating sections 124. A pair of grounding contacts 130 are located by two sides of the pair of signal contacts 120 are mechanically and electrically connected to the inner ground shell 300, and located by two sides of the pair of signal contacts 120 in the transverse direction. The front mating sections 124 are adapted for being directly mated with circuit pads 802 of a printed circuit board disposed in a plane, and the rear cable 200 extends along a direction inclined with the plane.

Each cable assembly module 100 further comprises a shielding shell forms a dividing wall 410 so as to perform shielding effect between the front mating member 110 of one cable assembly module 100 in a front row and that of another cable assembly module 100 in a rear row which are densely arranged with each other in a front-to-back direction. The shielding shell comprises an inner shielding shell 300 enclosing a front portion of the rear cable 200. The rear cable 200 further comprises a grounding/drain wire 220 electrically connected with the inner shielding shell 300. In this embodiment, the inner shielding shell 300 is a tubular metallic shell mechanically connected to the grounding wire 220 of the cable 200, and includes a platform 302 on which the mating member 110 is seated. The grounding contacts 130 are mechanically and electrically connected to the inner ground shell 300, and located by two sides of the pair of signal contacts 120 in the transverse direction.

The shielding shell comprises an outer shielding shell 400 enclosing and electrically connected with the inner shielding shell 300. The outer shielding shell 400 is electrically connected with the pair of the grounding contacts 130. In this embodiment, the outer shielding shell 400 is a tubular metallic outer wrap-around shell 400. The dividing wall 410 unitarily formed on the outer shielding shell, and split from a bottom wall 412 of the wrap-around shell 400 to form an opening 414 in front of the dividing wall 410. The front mating member 110 downwardly extends through the opening 414 to allow the front mating sections 124 of the signal contacts 120 to be seated upon the corresponding circuit pads 802 for connection.

Understandably, the retainer 900 may form the inclined channel or entrance 902 to regulate the corresponding cable assembly module 100 in position. A supporting plate 904 is detachably attached to the retainer 900 to complete the inclined channel or entrance 902 after the cable assembly modules 100 are installed within the retainer 900 in an oblique manner. The lower inclined wall 903 is formed on a top surface of the supporting plate 904. The lateral sides of the outer shielding shell 400 may form the corresponding interengaging structures, e.g. the tenon and the mortise, so as to allow the neighboring cable assembly modules 100 to be retain together as one piece along one row.

In this embodiment, only 2×2 cable assembly modules 100 are exemplified. Anyhow, the N×M matrix arrangement of the cable assembly modules 100 can be implemented. In this embodiment, the inner shielding shell 300 and the outer shielding shell 400 commonly forming the shielding shell structure, are discrete from each other. Alternately, a unified structure may be feasible. In this embodiment, the pair of grounding contacts 220 are discrete from the inner ground shell 300. Alternately, the pair of grounding contacts may be unitarily formed upon the inner shielding shell 300.

In this embodiment, the dividing wall 410 is located between the neighboring cable assembly module 100 in the front-to-back direction. Alternately, the dividing wall 410 may be located between the neighboring cable assembly module 100 in the transverse direction perpendicular to both the front-to-back direction and the vertical direction. Notably, in this embodiment, the rear side of the mating member 110 is recessed to receive the corresponding dividing wall 410 therein.

Figure 17A:
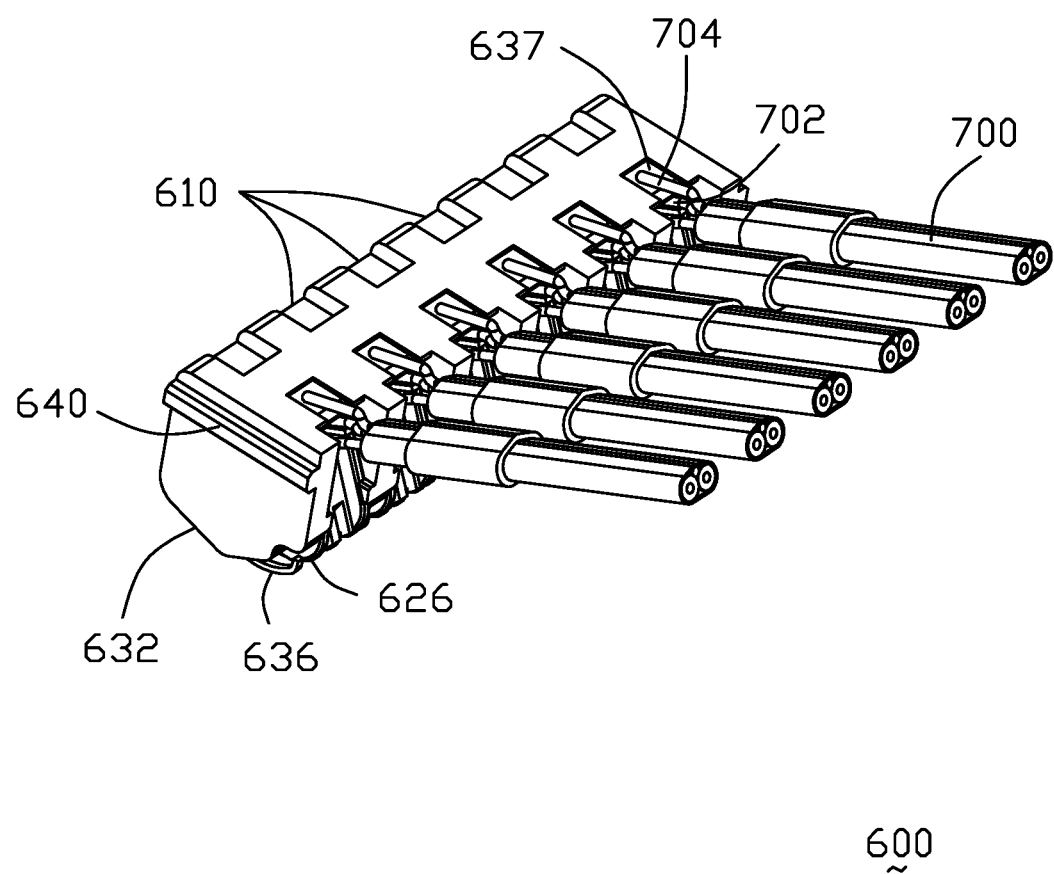
FIG. 17(A) is a perspective view of the single cable module of the electrical cable assembly of FIG. 15(A)
Figure 17B:
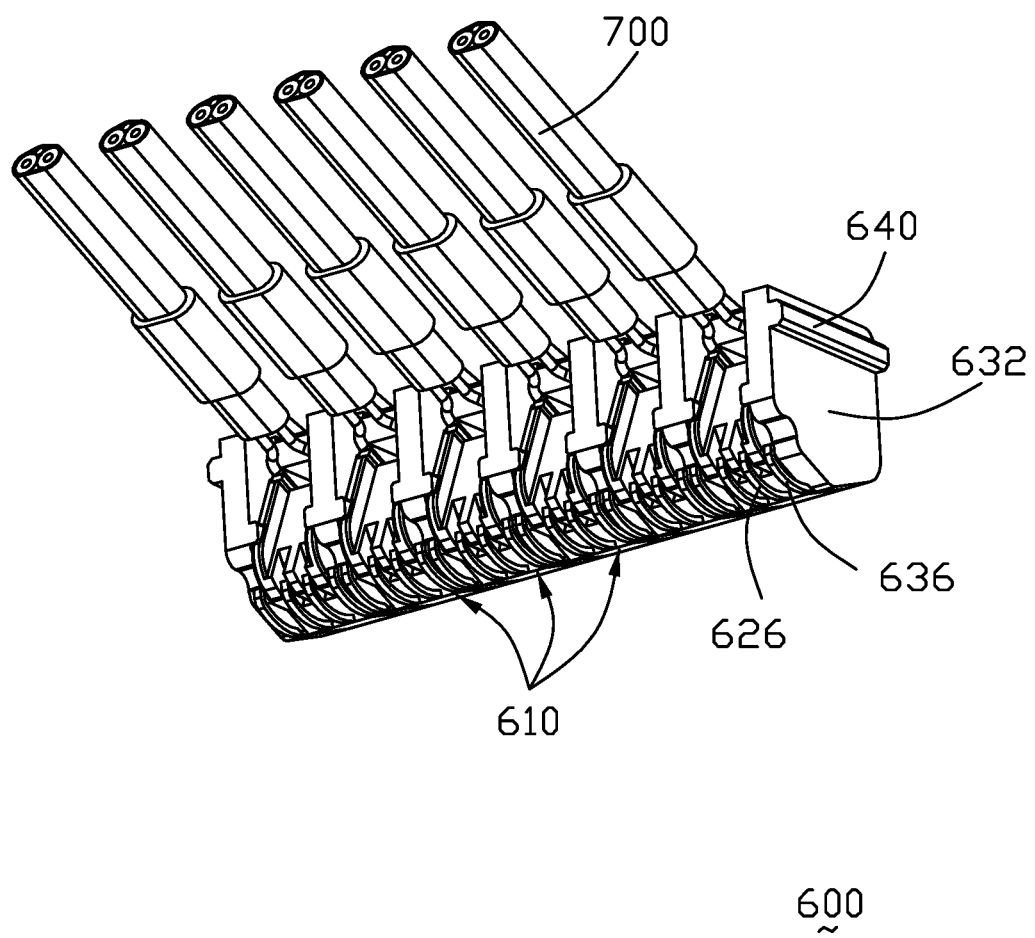
FIG. 17(B) is another perspective view of the single cable module of the electrical cable assembly of the electrical assembly of FIG. 17(A)
Figure 17C:
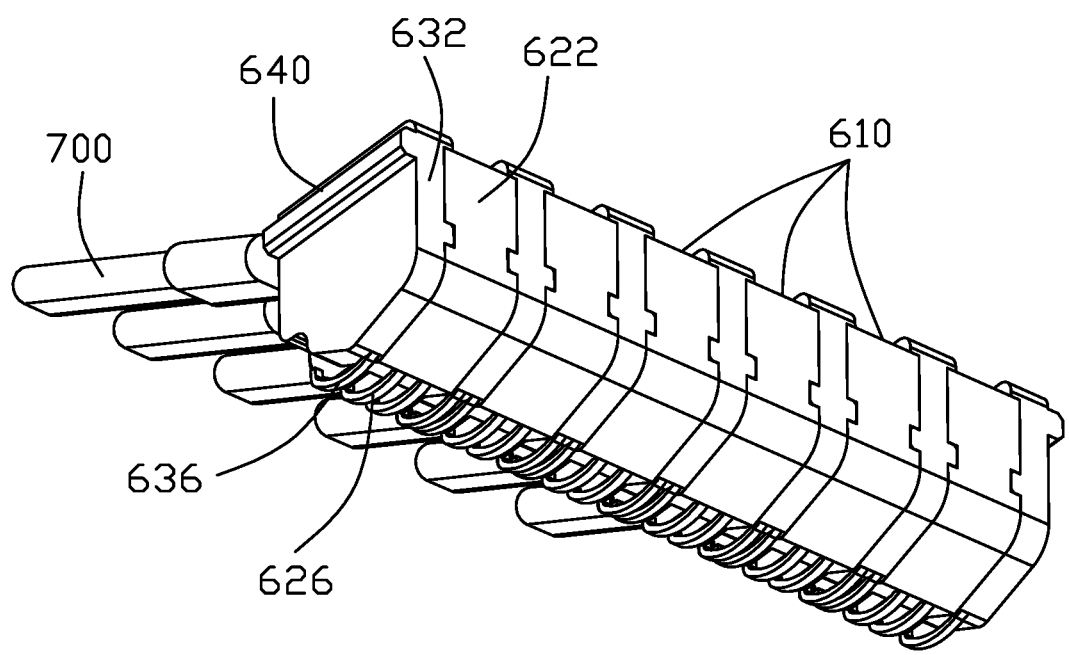
FIG. 17(C) is another perspective view of the single cable module of the electrical cable assembly of FIG. 17(A)
Figure 17D:
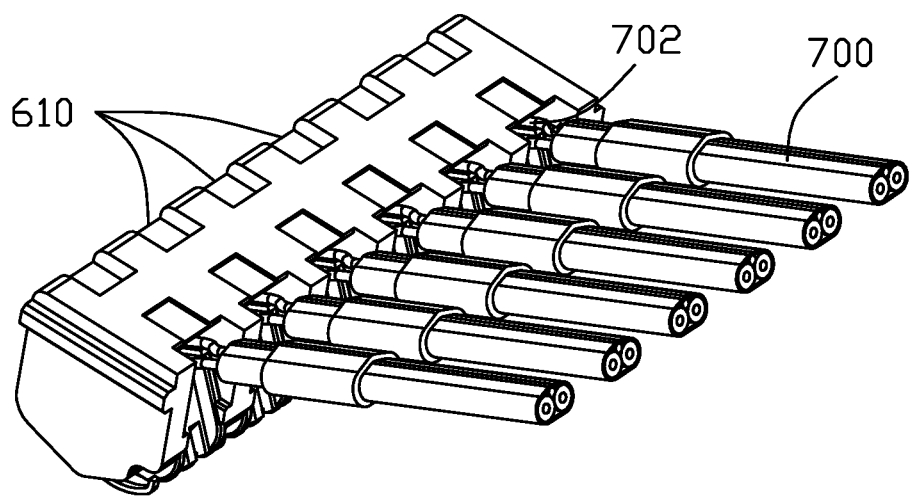
FIG. 17(D) is another embodiment perspective view of the single cable module of the electrical cable assembly of FIG. 15(A)
Figure 18A:
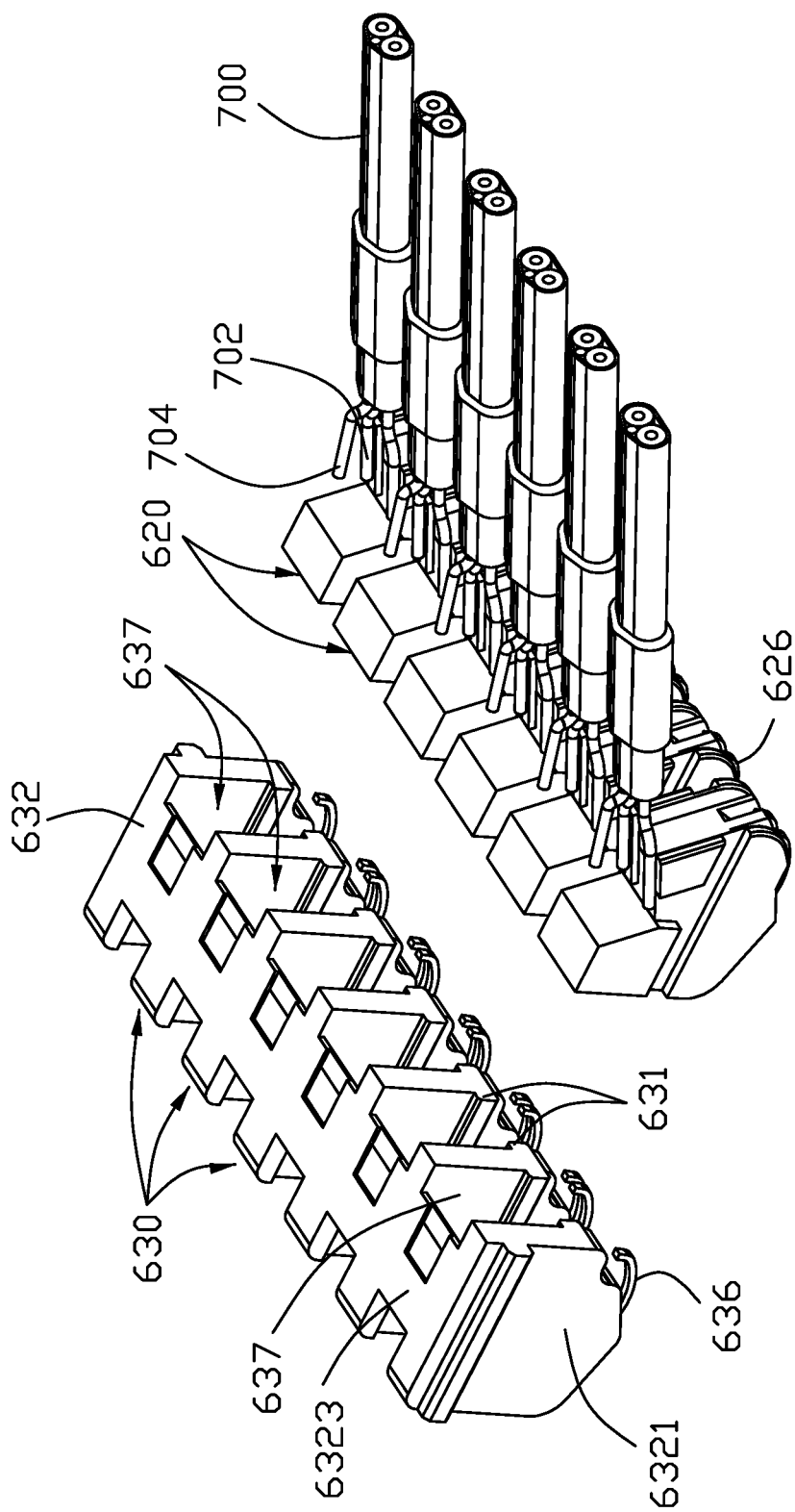
FIG. 18(A) is an exploded perspective view of the single cable module of the electrical cable assembly of FIG. 17(A)
Figure 18B:
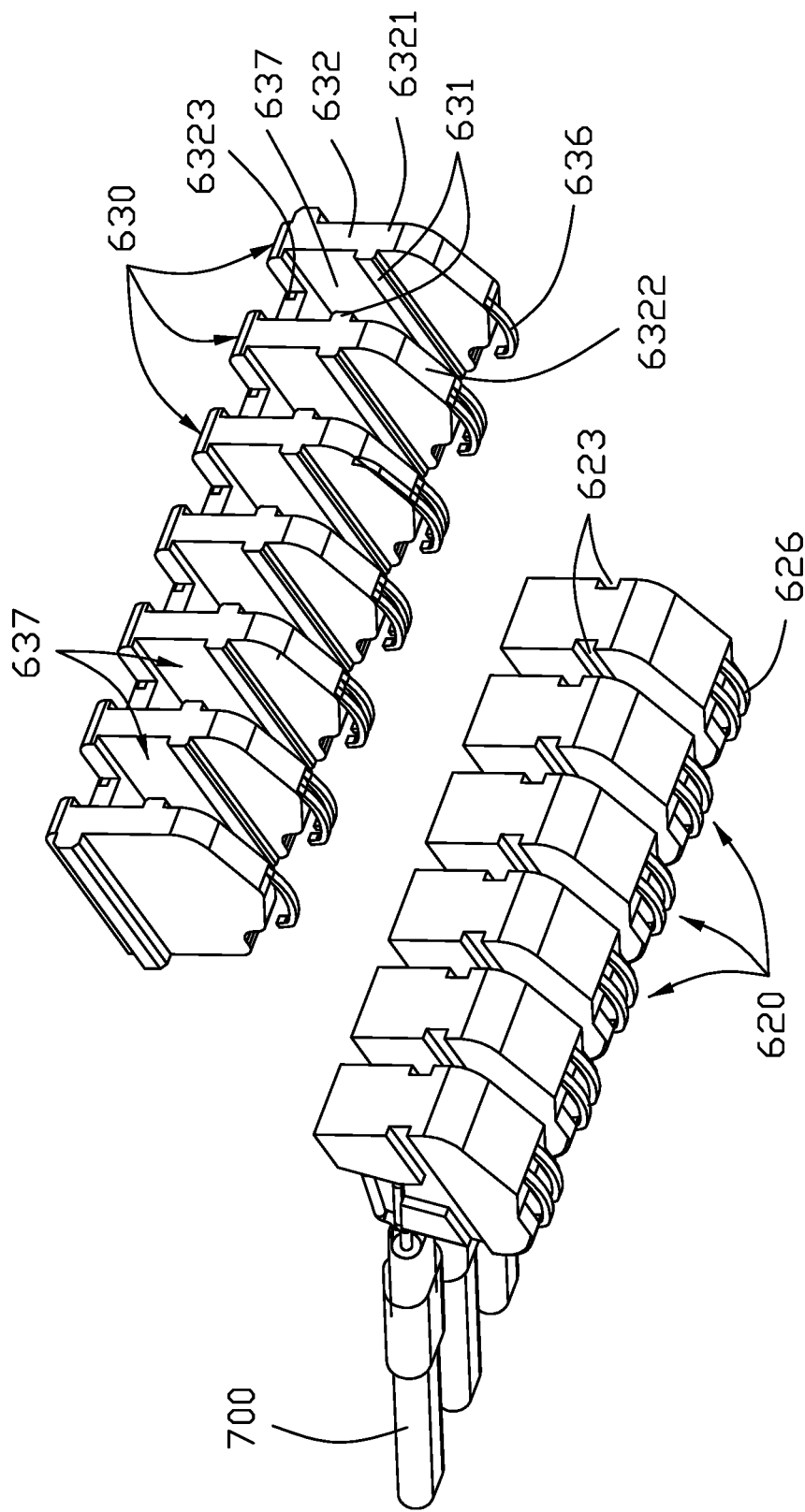
FIG. 18(B) is another exploded perspective view of the single cable module of the electrical cable assembly of FIG. 18(A)
Figure 19A:
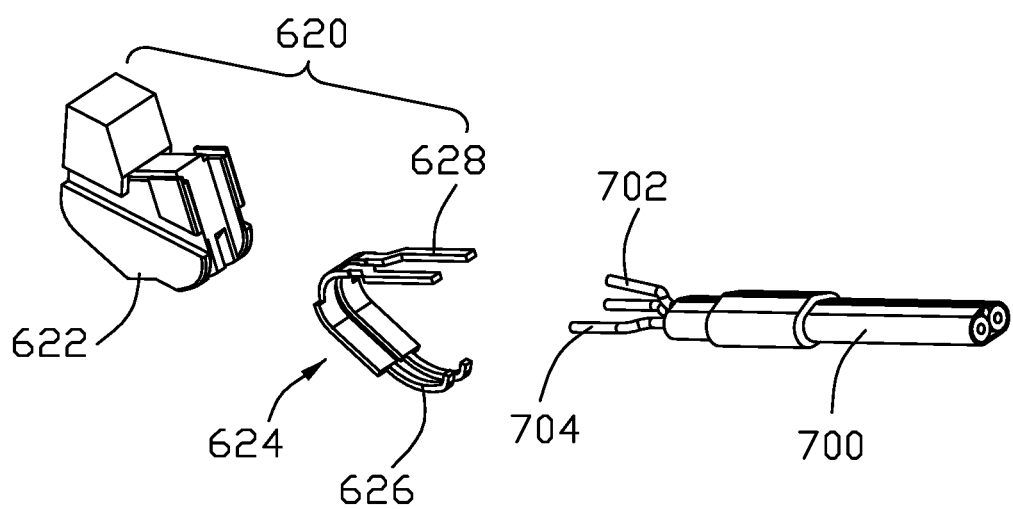
FIG. 19(A) is a further exploded perspective view of a portion of the unit of the single cable module of the electrical cable assembly of FIG. 18(A)
Figure 19B:
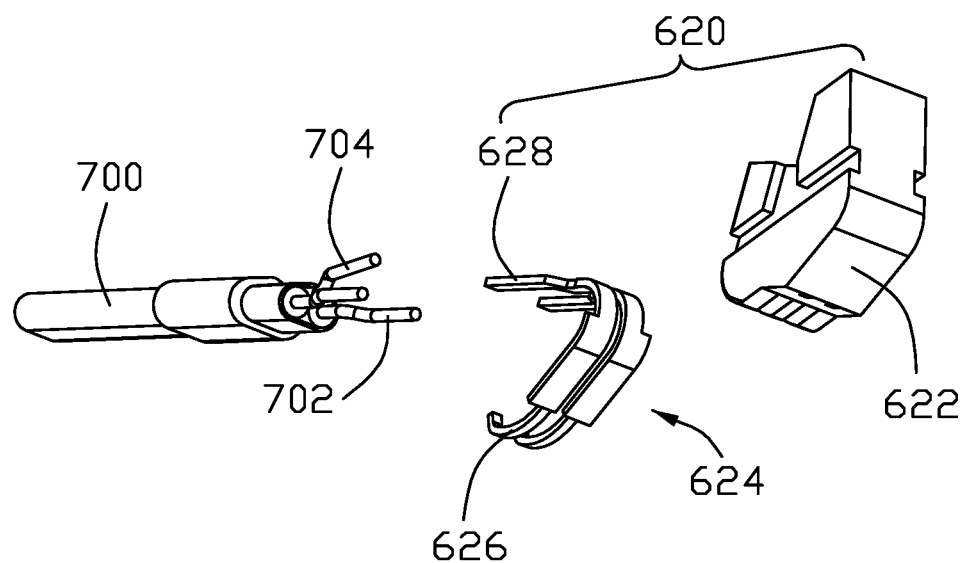
FIG. 19(B) is another exploded perspective view of the portion the unit of the single cable module of the electrical cable assembly of FIG. 19(A)
Figure 20A:
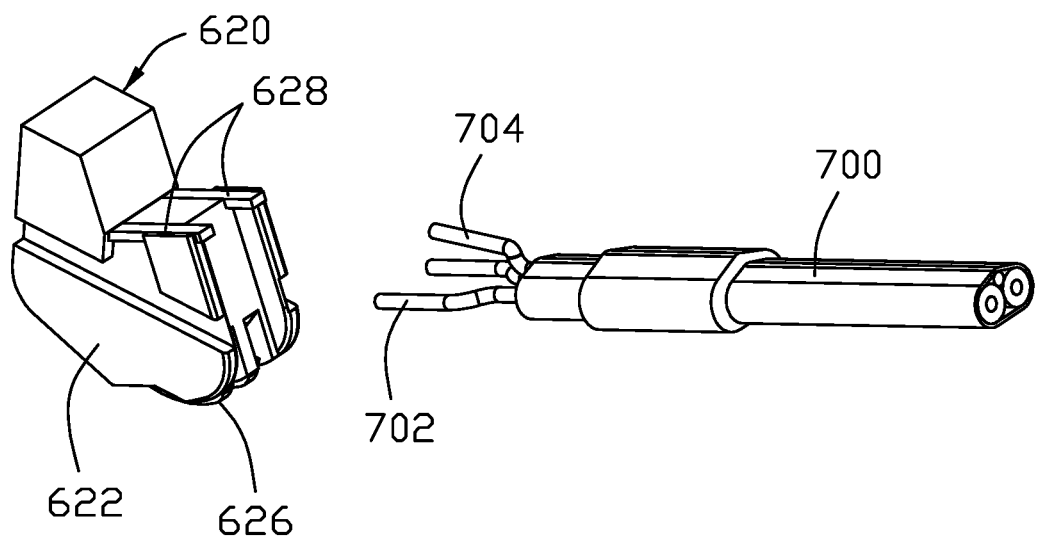
FIG. 20(A) is an exploded perspective view of the portion of the unit of the single cable module of the electrical cable assembly of FIG. 19(A) wherein the signal contacts are integrally formed within the insulator.
Figure 20B:
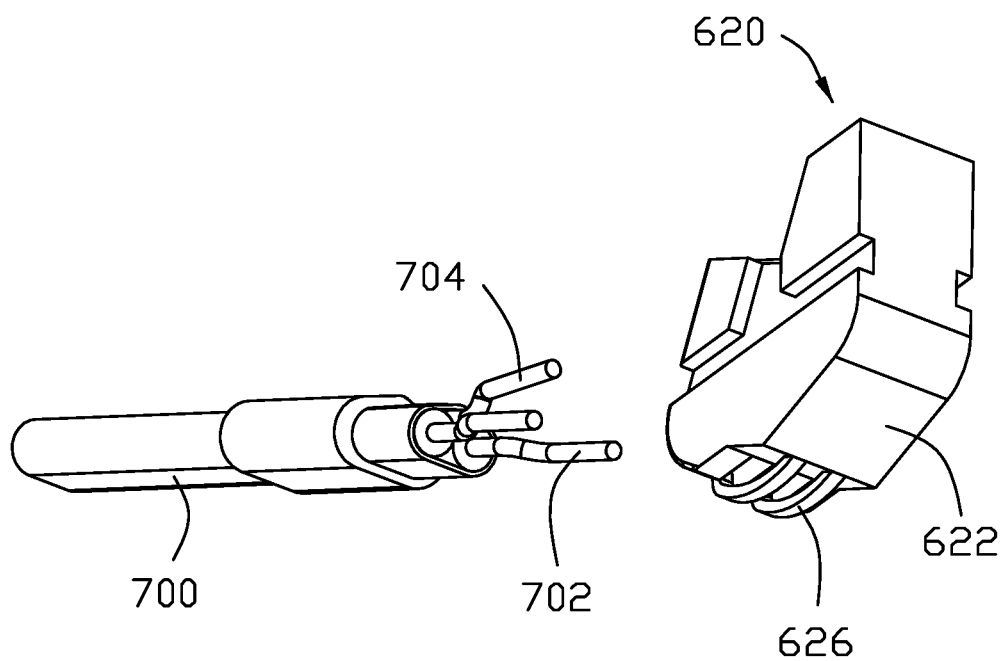
FIG. 20(B) is another exploded perspective view of the portion of the unit of the single cable module of the electrical cable assembly of 20(A)
Figure 21A:
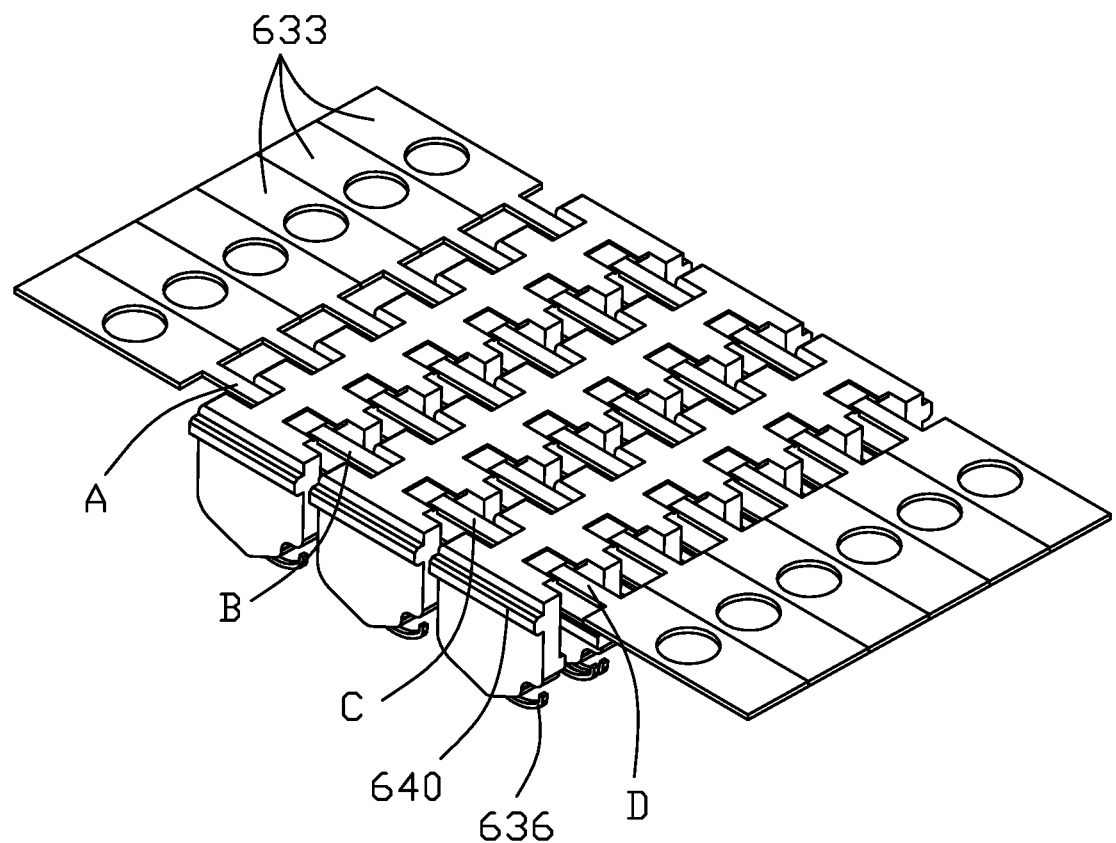
FIG. 21(A) is a perspective view of a first embodiment of a housing units and corresponding grounding contact carriers integrally formed together of the electrical cable assembly of FIG. 11(A)
Figure 21B:
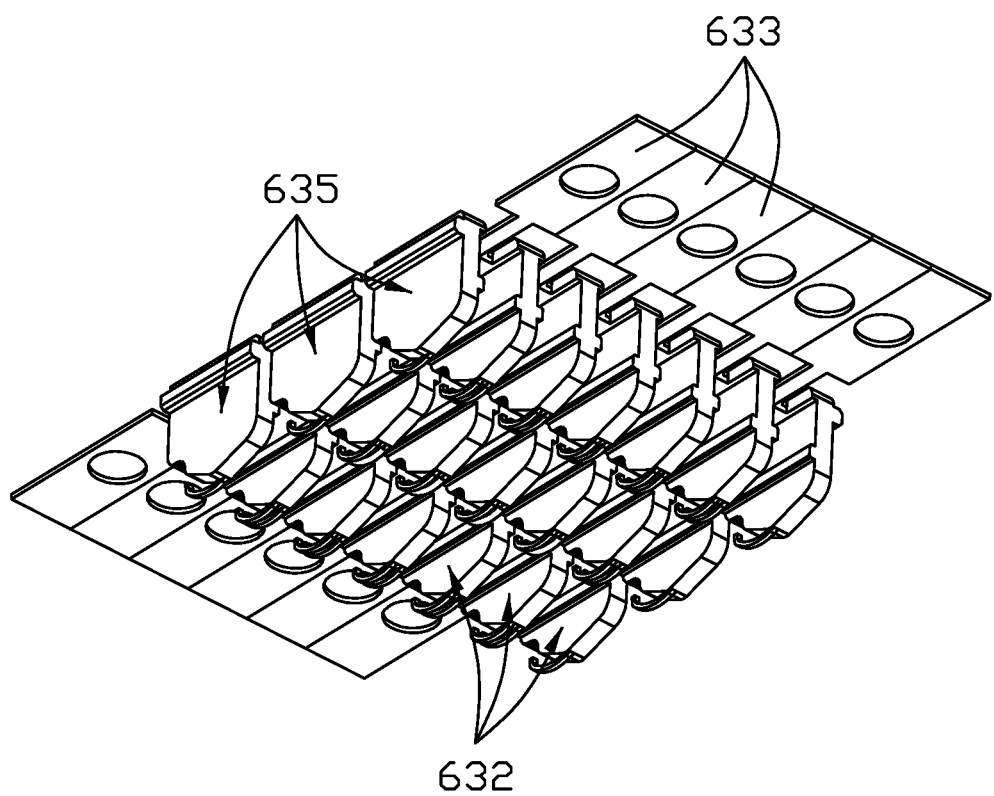
FIG. 21(B) is another perspective view of the housing units and the corresponding grounding contact carriers of the electrical cable assembly of FIG. 21(A)
Figure 22A:
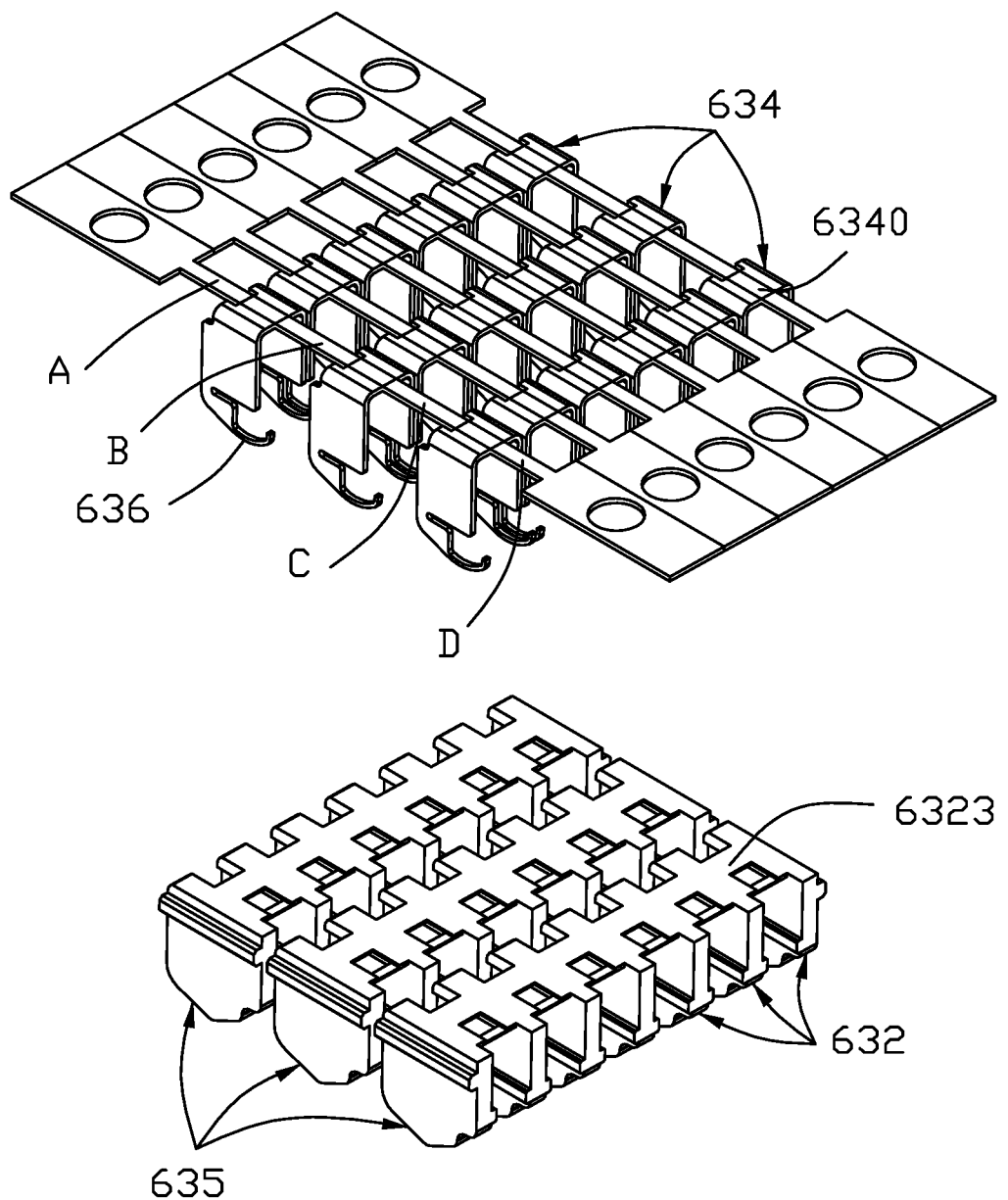
FIG. 22(A) is an exploded perspective view of the housing units and the corresponding grounding contact carriers of the electrical cable assembly of FIG. 21(A)
Figure 22B:
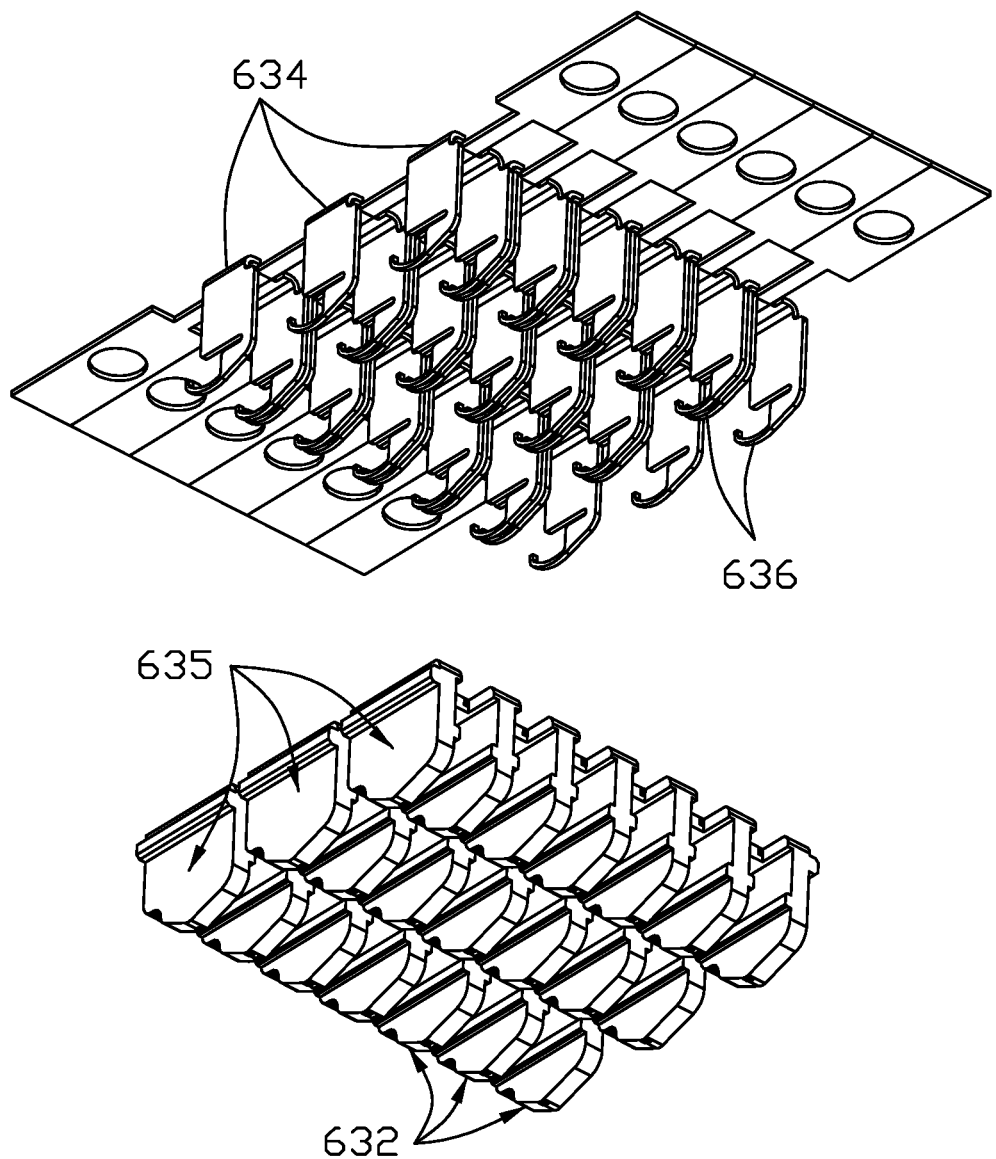
FIG. 22(B) is another exploded perspective view of the housing units and the corresponding grounding contact carriers of the electrical cable assembly of FIG. 22(A)
Figure 23:
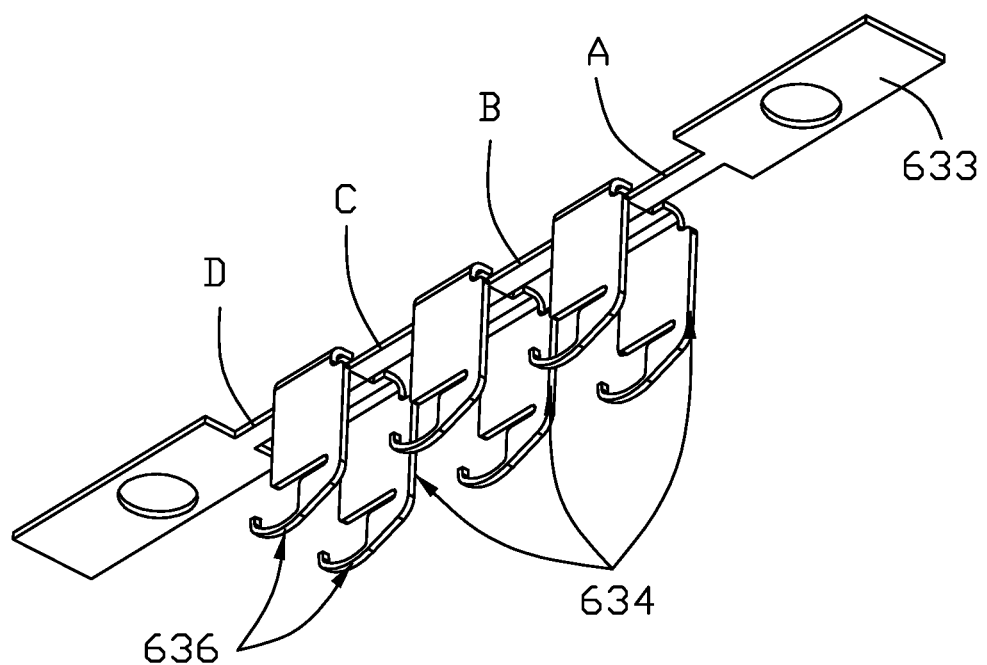
FIG. 23 is a perspective view of the grounding contact carrier of FIG. 22(A)
Figure 24A:
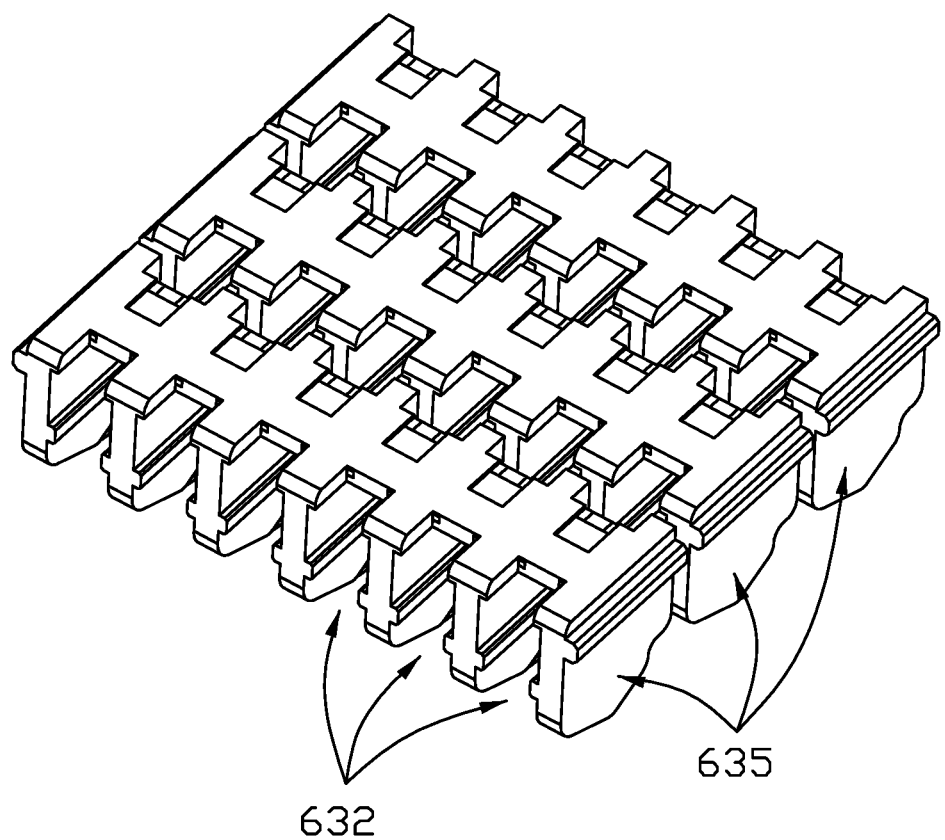
FIG. 24(A) is a perspective view of the housing units of FIG. 22(A)
Figure 24B:
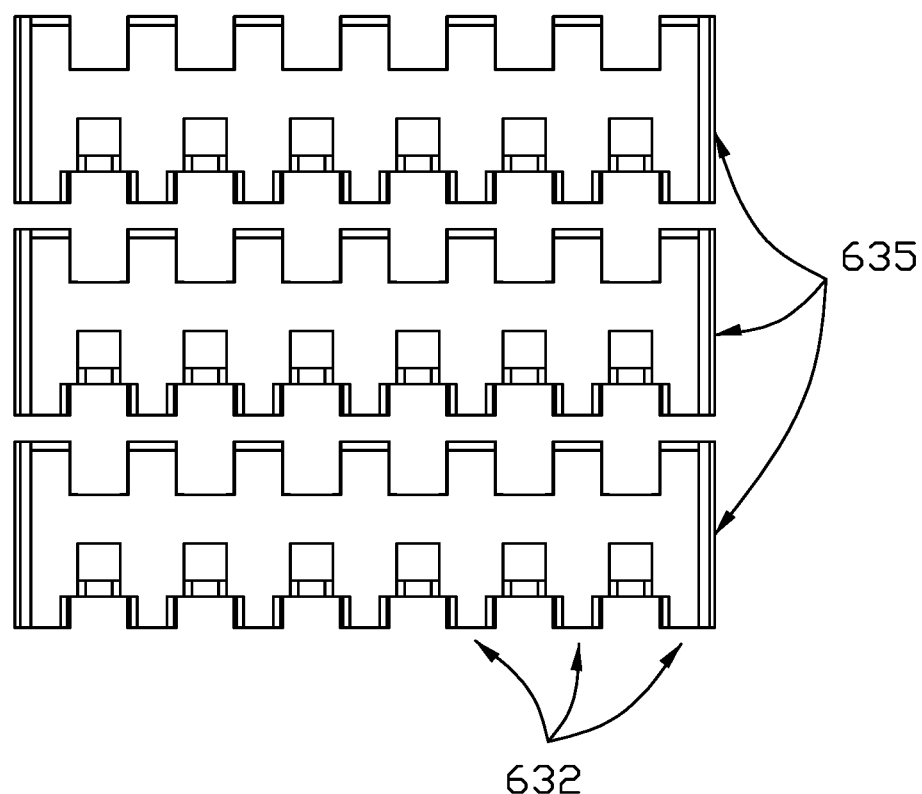
FIG. 24(B) is a top view of the housing units of FIG. 24(A)
Figure 25A:
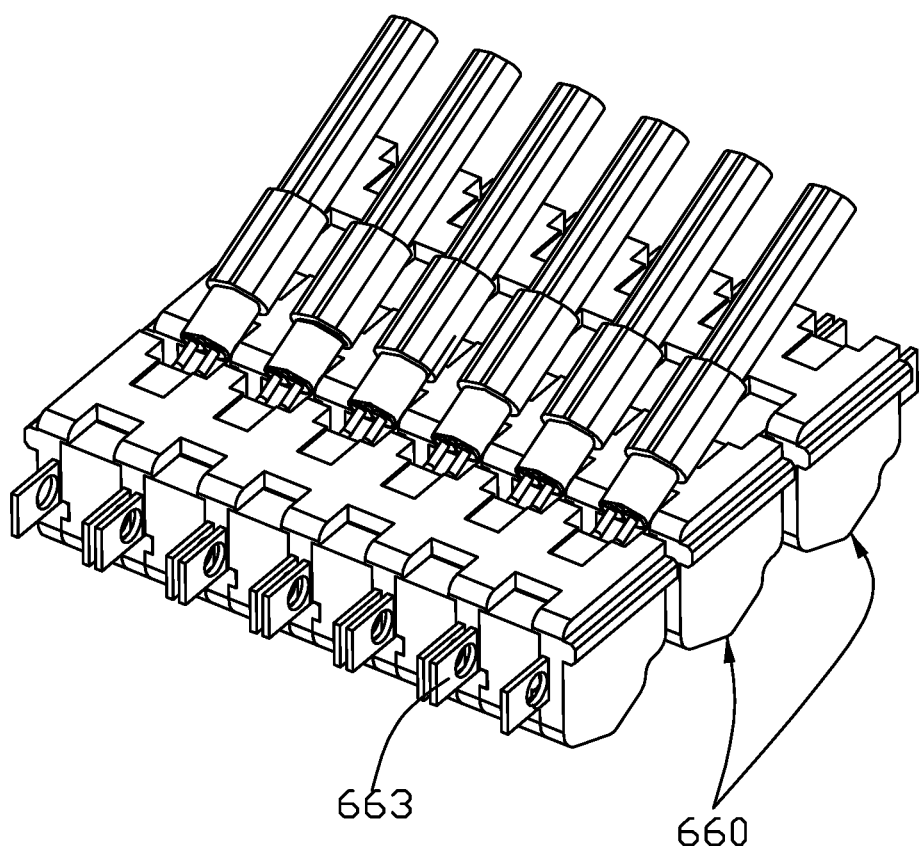
FIG. 25(A) is a perspective view of a second embodiment of the cable modules of the electrical cable assembly of FIG. 11(A)
Figure 25B:
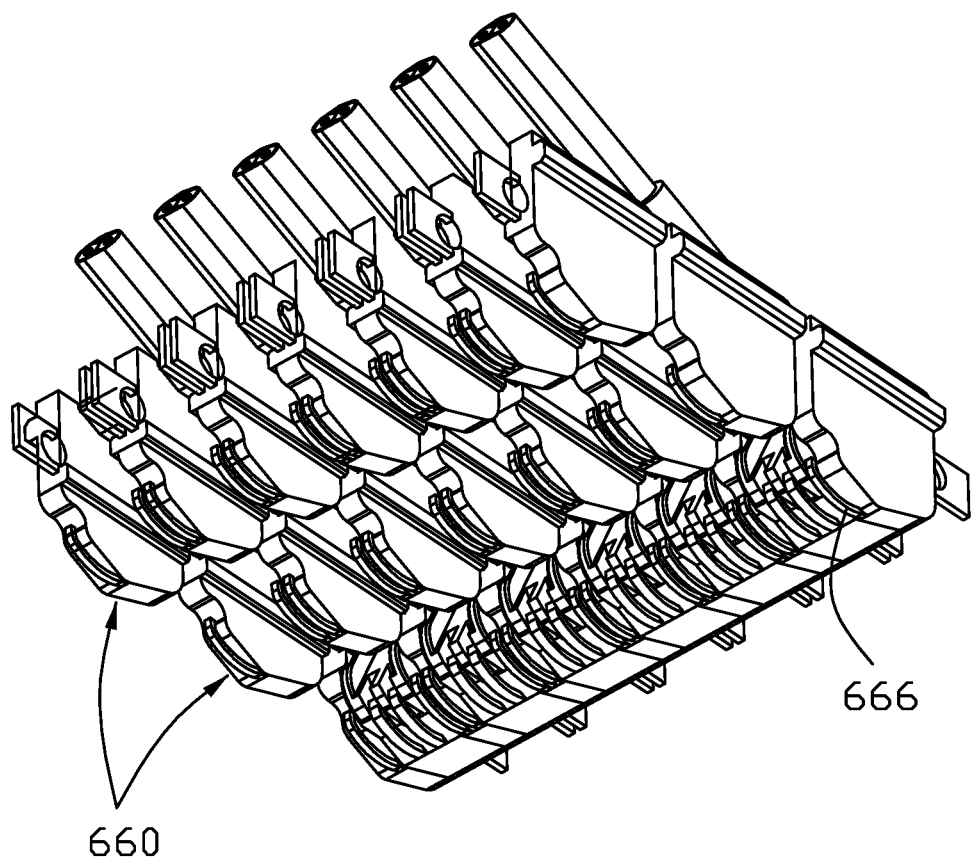
FIG. 25(B) is another perspective view of the cable modules of electrical cable assembly of FIG. 25(A)
Figure 26B:
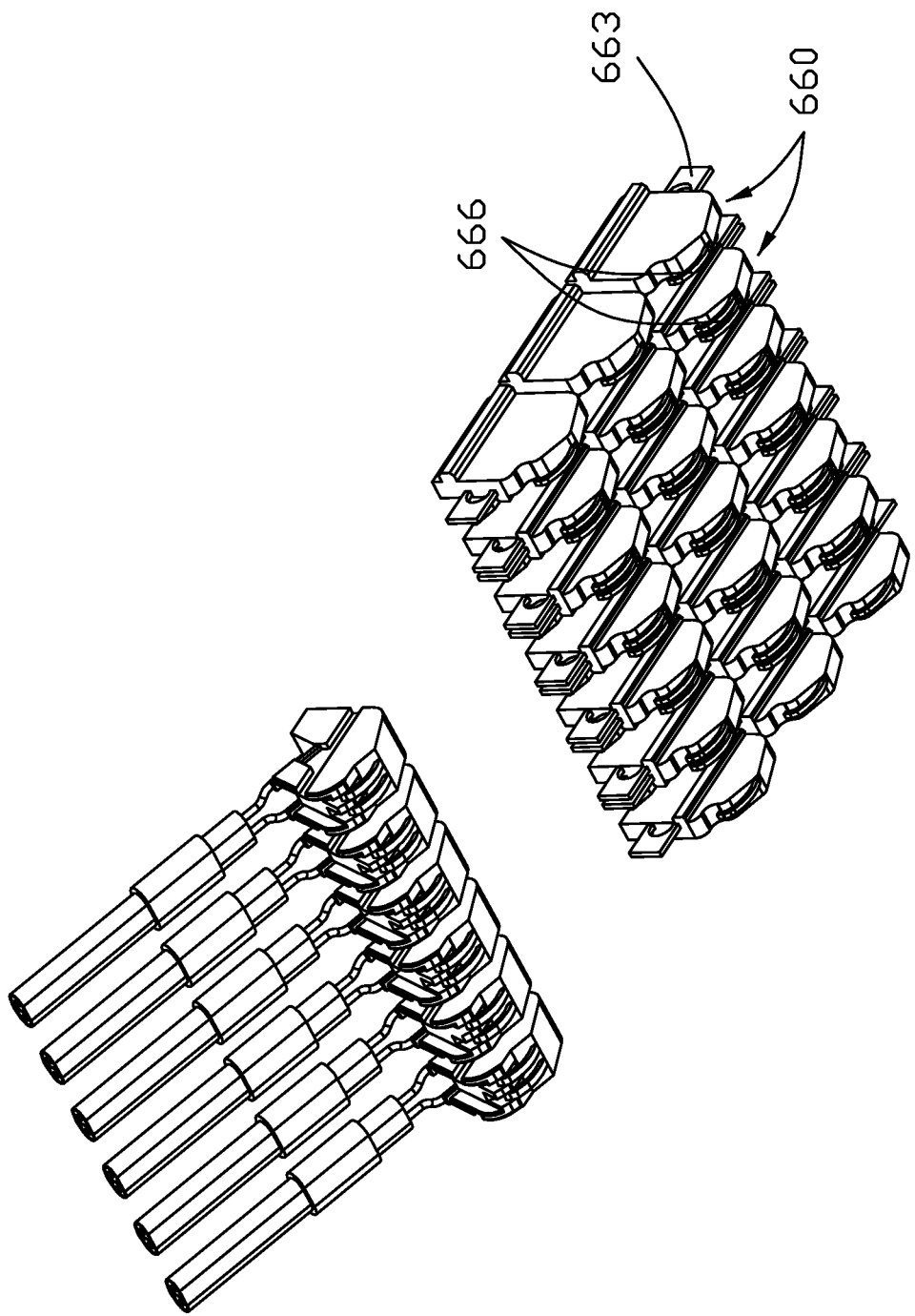
FIG. 26(B) is another exploded perspective view of the cable modules of the electrical cable assembly of FIG. 26(A)
Figure 27A:
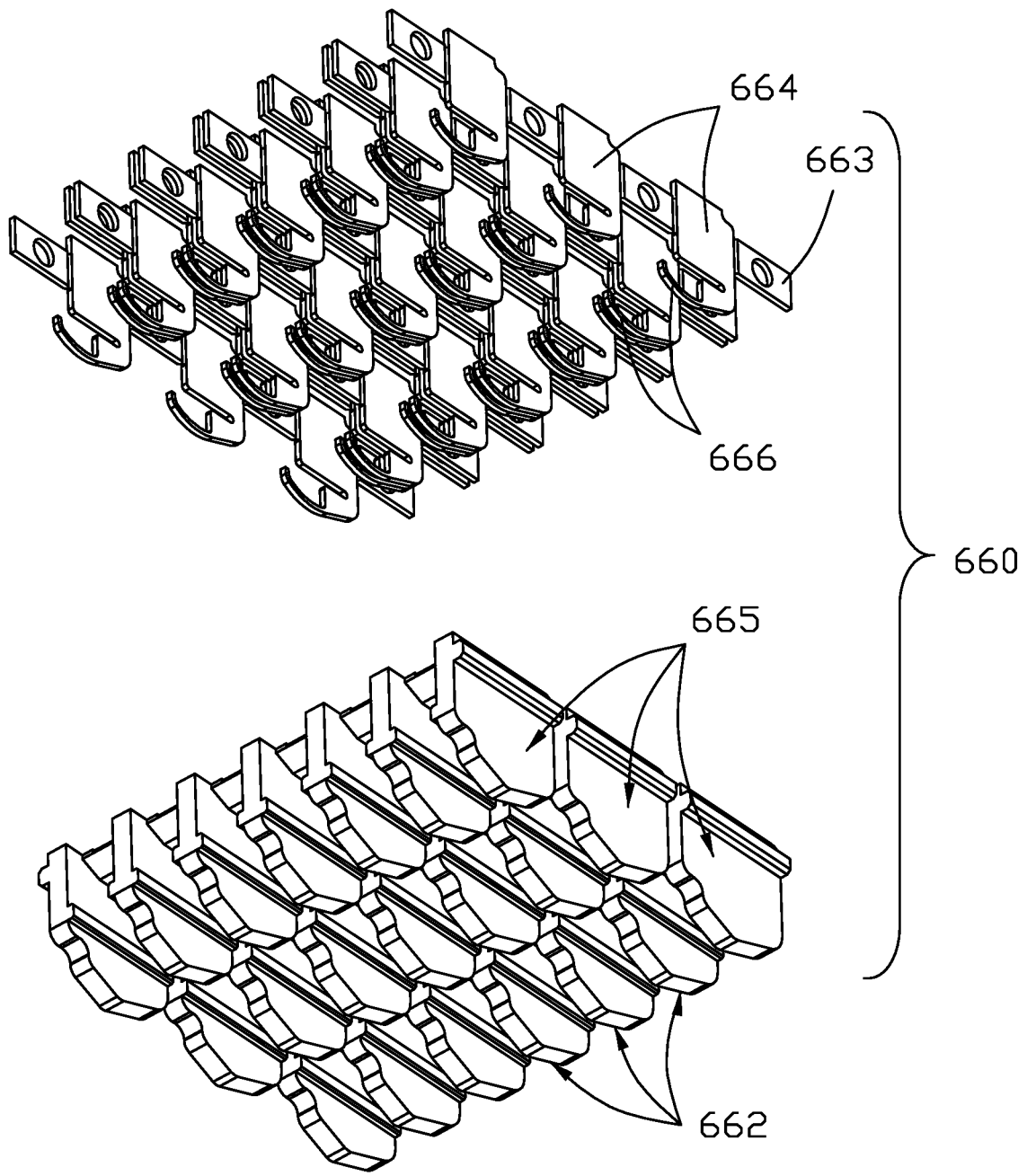
FIG. 27(A) is an explode perspective view of the housing units and the corresponding grounding contact carriers of the cable modules of the electrical cable assembly of FIG. 26(A)
Figure 27B:
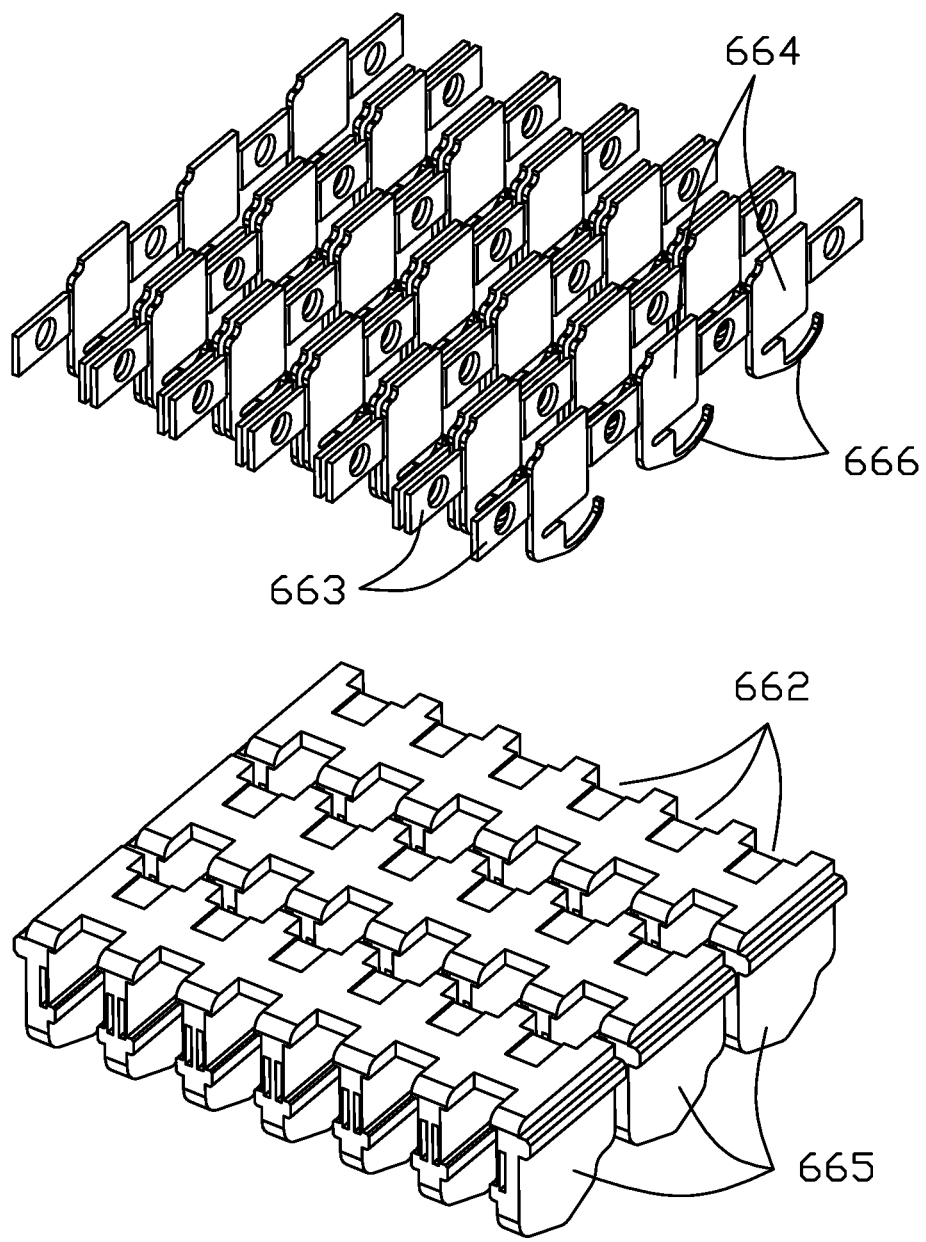
FIG. 27(B) is another exploded perspective view of the housing and the corresponding grounding contact carriers of the cable modules of the electrical cable assembly of FIG. 27(A)
Figure 28:
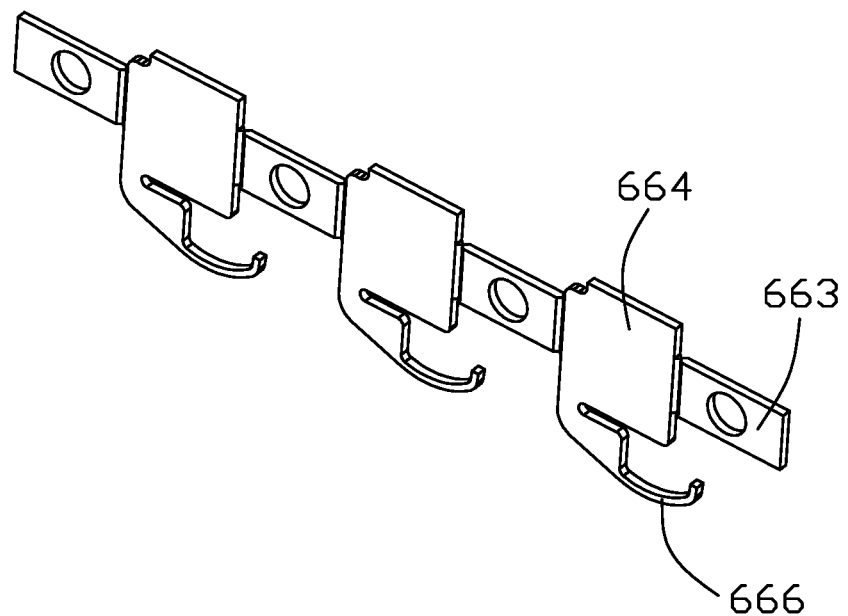
FIG. 28 is a perspective view of the grounding contact carrier of the cable module of the electrical cable assembly of FIG. 27(A)
Figure 29:
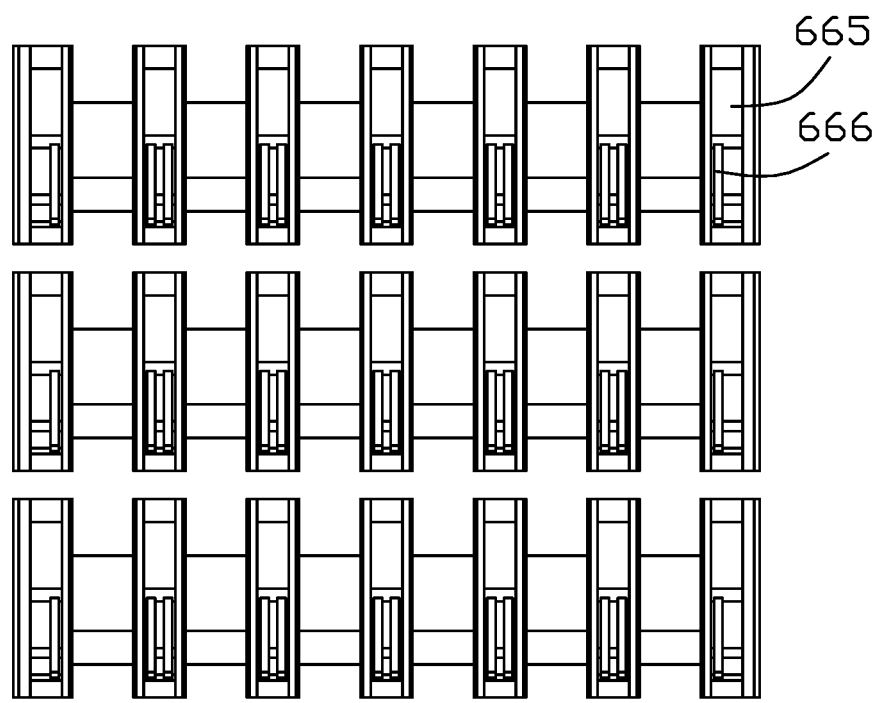
FIG. 29 is a bottom view of the housing units and the grounding contact carriers of the cable module of the electrical cable assembly of FIG. 27(A).

Referring to FIGS. 11(A)-29, a second embodiment electrical cable assembly 500 of this invention includes a case 502 enclosing two sets of cable modules 600 arranged in two rows along the transverse direction X. Each set of cable modules 600 includes a plurality of units 610 side by side arranged with one another along the row direction, i.e., the transverse direction. Each unit 610 includes a signal contact part 620 and a grounding contact part 630. The signal contact part 620 includes an insulator 622 or inner member integrally formed with a pair of signal contacts 624 via an insert-molding process. The signal contact 624 includes a deflectable contacting section 626 exposed upon a bottom side of the insulator 622, and a connecting section 628 exposed upon a top side of the insulator 622. The grounding contact part 630 includes an insulative housing unit 632 or outer member integrally formed with a U-shaped grounding contact 634. The grounding contact 634 includes a pair of deflectable contacting sections 636 exposed upon a bottom side of the housing unit 632 and a connecting section 638 exposed upon a top side of the housing unit 632. The housing unit 632 or outer member comprises a first side wall 6321, a second side wall 6322 spaced apart from and parallel to the first side wall 6321, a connecting wall 6323 connected therebetween, and a cavity or receiving space 637 formed by the first side wall 6321, the second wall 6322 and the connecting wall 6323. 12. One of the grounding contacts 634 is molded in the first side wall 6321, and the other one of the grounding contacts 634 is molded in the second side wall 6322. Notably, the insulator 622 is forwardly, along the front-to-back direction Y, inserted into and received within a cavity or receiving space 637 of the housing unit 632. Each unit 610 further includes a cable 700 composed of a differential pair of wires 702 and a drain wire or grounding wire 704 wherein the differential pair of wires 702 are soldered on the connecting sections 628 of the signal contact 624, and the drain wire 704 is soldered on the connecting section 638 of the grounding contact 634. A pair of grounding contacts 634 comprises a bridge member 6340 connected therebetween. The bridge is molded in the connecting wall 6323. The grounding wire 704 is mechanically and electrically connected to the bridge member 6340. The insulator 622 forms a pair of sliding grooves 623 receiving the corresponding sliding rails 631 of the housing unit 632. In this embodiment, the housing units 632 are unitarily formed together as one piece. Understandably, the housing units 632 of the grounding contact parts 630 in the same set of cable module 600 are unified together as one piece for not only reinforcement but also unification. In addition, the U-shaped configuration of the grounding contact 634 not only efficiently shield the corresponding differential pair signal contacts 642 therein but also reinforce the structure of the unified housing 635. The cables 700 of all units 610 are joined together as the round cable 710 to extend out of a rear end of the case 502. Referring to FIG. 17(D), the cable 700 is omitted drain wire and the pair of grounding contacts 634 are omitted bridge member.

Referring to FIGS. 11-29, the grounding contact part 630 is made by providing a plurality of grounding contact carriers 633 side by side intimately arranged with one another along the transverse direction wherein each contact carrier 633 unitarily includes three grounding contacts 634 along the front-to-back direction. The housing units 632 are integrally formed on the grounding contact carriers 633 via an insert-molding process to have the housing units 632 in the same row along the transverse direction are joined with one another as one piece unified housing 635. The three housings 635 each made by the unified housing units 632, are separated from one another by severing the portions A, B, C and D of the grounding contact carrier 633. The uniformed housing 635 include a pair of guiding rails 640 on opposite external side faces so as to be received within the corresponding guiding grooves (not shown) in the interior surfaces of the case 502.

In this embodiment, the electrical cable assembly 500 is inserted into a space 602 of the retainer 900' which is mounted upon the printed circuit board 950'. Two rows of circuit pads 952' are formed on the printed circuit board 950' under the space 602. The case 502 of the electrical cable assembly 500 further forms a pair of guiding protrusions 504 on two opposite exterior surfaces to be received within the corresponding guiding grooves 902' formed in an interior surfaces of the retainer 900' wherein the guiding groove 902' extends obliquely. Understandably, because the case 502 is assembled into the retainer 400 in the oblique direction, the contacting sections 626 and 636 are deflected in the vertical direction Z to efficiently mechanically and electrically connect to the corresponding circuit pads 952', respectively, when the case 502 reaches the final position. Understandably, the case 502 and the retainer 900' may form some retention mechanism for reliably maintaining the case 502 in position within retainer 900'.

The feature of the invention is to provide two rows of the cable modules 600 with the corresponding two rows of deflectable contacting sections 626, 636 which are deflected to connect the corresponding circuit pads 952' at the same time, wherein the mating face of the case 502 commonly defined by the bottom sides of the units 610 of both two sets of cable modules 600 is oblique to the primary plane of the case and located at the front end of the electrical cable assembly 500. In other words, the oblique arrangement for plural rows of cable modules while still keeping the corresponding contacting sections of all cable modules in the same level, is the feature of the instant invention.

FIGS. 25(A)-29 show another embodiment of the grounding contact unit 660. Each grounding contact part 660 includes a pair of grounding contacts 664 insert-molded within two opposite side walls of an insulative housing unit 662. The grounding contact 664 includes a deflectable contacting section 666 on a bottom side of the insulator 662 for connecting to the corresponding circuit pad on the printed circuit board. Understandably, in this embodiment the contact carrier 663 lies in a vertical plane so as not to form the corresponding connecting section for soldering to the corresponding drain wire. Anyhow, the grounding contact may be provided with the horizontal connecting section by the contact carrier 663 for soldering to the corresponding drain wire, if necessary. Similar to the first embodiment, the housing units 662 in the same row along the transverse direction are joined together to form a unified housing 665.

What is claimed is:

1. A cable assembly module comprising:
a front mating member;
a rear cable linked behind the mating member and including a pair of signal wires;
a pair of signal contacts retained upon the front mating member, each of said signal contacts including a middle retaining section associated with the front mating member, a front mating section spaced from the front mating member in a deflectable manner, and a rear connecting section mechanically and electrically connected to the corresponding signal wires, respectively; and
a pair of grounding contacts located by two sides of the pair of signal contacts; wherein
the front mating sections are adapted for being directly mated with circuit pads of a printed circuit board lying in a plane, and the rear cable extends along a direction inclined with the plane.

2. The cable assembly module as claimed in claim 1, further comprising a shielding shell forms a dividing wall so as to perform shielding effect between the front mating member of one cable assembly module in a front row and that of another cable assembly module in a rear row which are densely arranged with each other in a front-to-back direction.

3. The cable assembly module as claimed in claim 2, wherein the shielding shell comprises an inner shielding shell enclosing a front portion of the rear cable, the rear cable comprising a grounding wire electrically connected with the inner shielding shell.

4. The cable assembly module as claimed in claim 3, wherein the shielding shell comprises an outer shielding shell enclosing and electrically connected with the inner shielding shell.

5. The cable assembly module as claimed in claim 4, wherein the outer shielding shell is electrically connected with the pair of the grounding contacts.

6. The cable assembly module as claimed in claim 4, wherein the dividing wall is unitarily formed on the outer shielding shell.

7. The cable assembly module as claimed in claim 4, wherein the outer shielding shell forms an opening in front of the dividing wall, and the mating member extends downwardly through the opening.

8. The cable assembly module as claimed in claim 2, wherein a rear side of the mating member is recessed to receive the dividing wall therein.

9. The cable assembly module as claimed in claim 1, wherein the middle retaining section grasps the front mating member, and the mating member forms grooves to receive front ends of the corresponding signal contacts, respectively.

10. The cable assembly module as claimed in claim 1, wherein the front mating member comprise an outer member and an inner member received in the outer member, the pair of grounding contacts molded in the outer member, the pair of signal contacts molded in the inner member.

11. The cable assembly module as claimed in claim 10, wherein the outer member comprises a first side wall, a second side wall spaced apart from and parallel to the first side wall, a connecting wall connected therebetween, and a receiving space formed by the first side wall, the second wall and the connecting wall, the inner member received in the receiving space.

12. The cable assembly module as claimed in claim 11, wherein one of the grounding contacts is molded in the first side wall, and the other one of the grounding contacts is molded in the second side wall.

13. The cable assembly module as claimed in claim 12, wherein the pair of grounding contacts comprises a bridge member connected therebetween, the bridge molded in the connecting wall, the rear cable comprising a grounding wire mechanically and electrically connected to the bridge member.

14. The cable assembly module as claimed in claim 1, further comprising a case enclosing the front mating member, the case comprising guiding protrusion on exterior surface.

15. An electrical assembly comprising:
a printed circuit board having two rows of circuit pads thereon;
a retainer assembled upon the printed circuit board to cover said circuit pads;
two rows of identical cable assembly modules spaced from each other in a front-to-back direction, each of said cable assembly modules comprising a front mating member with corresponding contacts thereon, and a rear cable mechanically and electrically connected to the contacts; wherein
the cable assembly modules are assembled into the retainer in an oblique manner.

16. The electrical assembly as claimed in claim 15, wherein the retainer comprises an upper inclined wall, and a lower inclined wall spaced apart from and parallel to the upper inclined wall, and a inclined channel formed therebetween for the cable assembly modules being entered into the retainer to mate with the circuit pads.

17. The electrical assembly as claimed in claim 15, further comprising a case enclosing the cable assembly modules, the case comprising a guiding protrusion on exterior surface, the retainer comprising a guiding groove for guiding the guiding protrusion.

18. An electrical assembly comprising:
a retainer defining an internal space and a bottom face adapted to be mounted to a printed circuit board having corresponding pads thereon wherein the bottom face forms an opening to allow the internal space to downwardly communicate with the pads of the printed circuit board;
two sets of cable modules commonly located within the internal space and spaced from each other in a front-to-back direction, each set of cable modules including an elongated unitary housing enclosing a plurality of units along a transverse direction perpendicular to the front-to-back direction, each unit including a mating member equipped with the signal contacts while the unitary housing being equipped with grounding contacts, both said signal contacts and said grounding contacts having rear/upper connecting portions mechanically and electrically connected to corresponding cables, and front/lower mating portions exposed around the bottom face of the retainer and adapted to be mated with the corresponding pads.

19. The electrical assembly as claimed in claim 18, wherein said two sets of cable modules are commonly enclosed within a case which has guiding mechanism so as to be assembled into the internal space of the retainer in an oblique direction perpendicular to both the transverse direction and the front-to-back direction.

20. The electrical assembly as claimed in claim 19, wherein each housing has a pair of guiding rails on two sides so as to guidably assemble the housing into the case, and the guiding rail extends in a direction oblique to an extension direction of the case.

* * * * *